(12) United States Patent
Jee et al.

(10) Patent No.: US 10,685,921 B2
(45) Date of Patent: Jun. 16, 2020

(54) SEMICONDUCTOR CHIP MODULE INCLUDING A CHANNEL FOR CONTROLLING WARPAGE AND METHOD OF MANUFACTURING THE SAME

(71) Applicant: SAMSUNG ELECTRONICS CO., LTD., Suwon-si, Gyeonggi-do (KR)

(72) Inventors: Young Kun Jee, Hwaseong-si (KR); Ji Hwang Kim, Hwaseong-si (KR); Un Byoung Kang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 39 days.

(21) Appl. No.: 16/198,978

(22) Filed: Nov. 23, 2018

(65) Prior Publication Data

US 2020/0020647 A1 Jan. 16, 2020

(30) Foreign Application Priority Data

Jul. 10, 2018 (KR) .......................... 10-2018-0079909

(51) Int. Cl.
| | |
|---|---|
| *H01L 23/48* | (2006.01) |
| *H01L 23/52* | (2006.01) |
| *H01L 23/40* | (2006.01) |
| *H01L 23/00* | (2006.01) |
| *H01L 23/29* | (2006.01) |
| *H01L 25/065* | (2006.01) |

(52) U.S. Cl.
CPC .......... *H01L 23/562* (2013.01); *H01L 23/293* (2013.01); *H01L 25/0652* (2013.01)

(58) Field of Classification Search
CPC ... H01L 24/13; H01L 23/562; H01L 23/3107; H01L 23/3171; H01L 23/528; H01L 23/3157; H01L 23/49833; H01L 23/5226; H01L 23/293; H01L 23/49822; H01L 23/49894; H01L 2924/18162; H01L 2924/19105; H01L 23/28; H01L 23/5386; H01L 25/18; H01L 25/043; H01L 25/0756
USPC ......................................................... 257/737
See application file for complete search history.

(56) References Cited

U.S. PATENT DOCUMENTS

| | | |
|---|---|---|
| 7,301,222 B1 | 11/2007 | Patwardhan et al. |
| 7,838,336 B2 | 11/2010 | Bartley et al. |
| 2008/0128916 A1* | 6/2008 | Soejima ................ H01L 21/561 257/777 |

(Continued)

FOREIGN PATENT DOCUMENTS

| | | |
|---|---|---|
| JP | 2008187137 A | 8/2008 |
| JP | 2014192171 A | 10/2014 |
| KR | 19980034136 A | 8/1998 |

*Primary Examiner* — Theresa T Doan
(74) *Attorney, Agent, or Firm* — Volentine, Whitt & Francos, PLLC

(57) ABSTRACT

A semiconductor chip module includes a chip package and a printed circuit board (PCB) to which the chip package is mounted. The chip package includes a substrate, a processor disposed in a central region of the substrate, a plurality of active chips disposed around the processor, a plurality of dummy chips disposed in spaces between the plurality of active chips, and an epoxy resin fixing the plurality of active chips and the plurality of dummy chips to the substrate. Channels of the epoxy resin extend between an uppermost surface of a chip body of each of the dummy chips and the substrate of the chip package to control or mitigate warping of the chip package.

20 Claims, 16 Drawing Sheets

(56) References Cited

U.S. PATENT DOCUMENTS

| | | |
|---|---|---|
| 2009/0079060 A1* | 3/2009 | Bartley ................ H01L 21/563 257/703 |
| 2016/0079201 A1 | 3/2016 | Do et al. |
| 2016/0365258 A1 | 12/2016 | Munding |
| 2017/0302980 A1 | 2/2017 | Hwang et al. |

* cited by examiner

SEMICONDUCTOR CHIP MODULE INCLUDING A CHANNEL FOR CONTROLLING WARPAGE AND METHOD OF MANUFACTURING THE SAME

PRIORITY STATEMENT

This application claims from Korean Patent Application No. 10-2018-0079909, filed on Jul. 10, 2018, the disclosure of which is hereby incorporated by reference in its entirety.

BACKGROUND

1. Field

The inventive concept relates to a semiconductor chip module and to a method of manufacturing the semiconductor chip module.

2. Description of Related Art

An active chip in which memory cell arrays are stacked has been developed to maximize memory capacity per unit area and data processing capacity. A plurality of such active chips may be placed on a wafer, a respective dummy chip may be disposed between adjacent ones of such active chips, and an epoxy resin may fill regions around the chips on the wafer to encapsulate the chips and help fix the chips to the wafer. Subsequently, the wafer may be cut into units referred to as "chip packages", and each chip package may be bonded to a printed circuit board (PCB) to form a chip module. When the epoxy resin hardens on the wafer, a chip package may warp to an extent proportional to the height of epoxy. When the chip package warps, it may not be possible to bond the chip package sufficiently to the PCB.

SUMMARY

According to an example of the inventive concept, there is provided a semiconductor chip module comprising a chip package and a printed circuit board (PCB) to which the chip package is mounted. The chip package includes a substrate, a processor disposed on the substrate in a central region of the substrate, a plurality of active chips disposed on the substrate around the processor, a plurality of dummy chips disposed on the substrate in spaces between the plurality of active chips, and epoxy resin fixing the plurality of active chips and the plurality of dummy chips to the substrate. Each of the dummy chips comprises a chip body having an upper surface, and the semiconductor chip module has channels of the epoxy resin interposed between the upper surface of the chip body of each of the dummy chips and the substrate of the chip package.

According to an example of the inventive concept, there is also provided a semiconductor chip module comprising a chip package and a printed circuit board (PCB) having an upper surface to which the chip package is mounted. The chip package includes a substrate having an upper surface, a processor disposed on the substrate in a central region of the upper surface of the substrate, a plurality of active chips disposed on the upper surface of the substrate around the processor, a plurality of dummy chips disposed on the upper surface substrate in spaces between the plurality of active chips, and epoxy resin fixing the plurality of active chips and the plurality of dummy chips to the substrate at the upper surface of the substrate. Each of the dummy chips comprises a chip body having an upper surface, and the semiconductor chip module has a plurality of first channels of the epoxy resin and a plurality of second channels of the epoxy resin interposed between the upper surface of the chip body of each of the dummy chips and the substrate of the chip package. The first channels extend longitudinally in a first axial direction and the second channels extend longitudinally in a second axial direction different from the first axial direction. Also, the first channels are spaced a predetermined distance apart from the plurality of second channels in a vertical direction perpendicular to the upper surface of the substrate of the chip package.

According to another aspect of the inventive concept, there is provided a semiconductor chip module comprising a chip package and a printed circuit board (PCB) to which the chip package is mounted. The chip package includes a substrate, a processor disposed in a central region of the substrate, a plurality of active chips disposed on the substrate around the processor, a plurality of dummy chips disposed on the substrate in spaces between the plurality of active chips, a plurality of dummy bump joints interposed between each of the dummy chips and the substrate, and an epoxy resin configured to package the plurality of active chips and the plurality of dummy chips. Each of the dummy chips comprises a chip body having an upper surface, the plurality of dummy bump joints are spaced laterally from each other to define spaces therebetween, and the spaces between the dummy bump joints are filled with the epoxy resin such that channels of the epoxy resin are interposed between the upper surface of the chip body of each of the dummy chips and the substrate of the chip package.

DETAILED DESCRIPTION

Examples of semiconductor chip modules and methods of manufacturing the semiconductor chip modules according to inventive concept will now be described in detail with reference to the accompanying drawings. Note, each of the examples described herein may have the layout shown in and described with reference to FIG. 1 but for the sake of brevity may be described in detail with reference to a cross-sectional view taken in the direction of line A1-A2 in FIG. 1 but through only one active chip 200.

Figure 1:
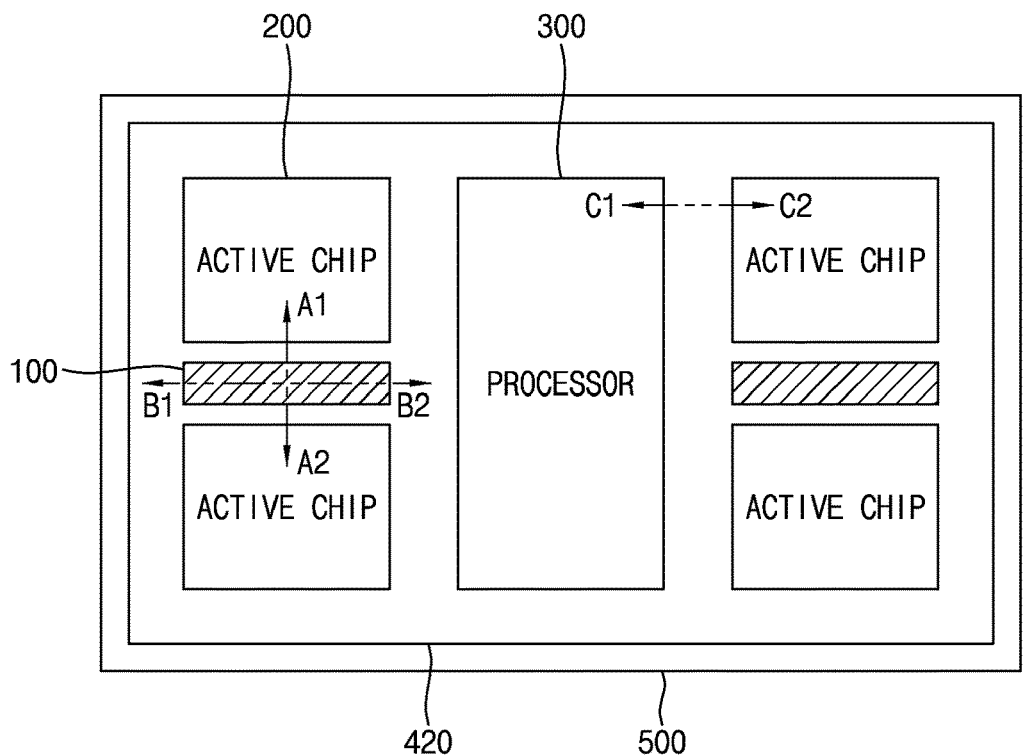
FIG. 1 is a plan view of an example of a semiconductor chip module according to the inventive concept.
Figure 2A:
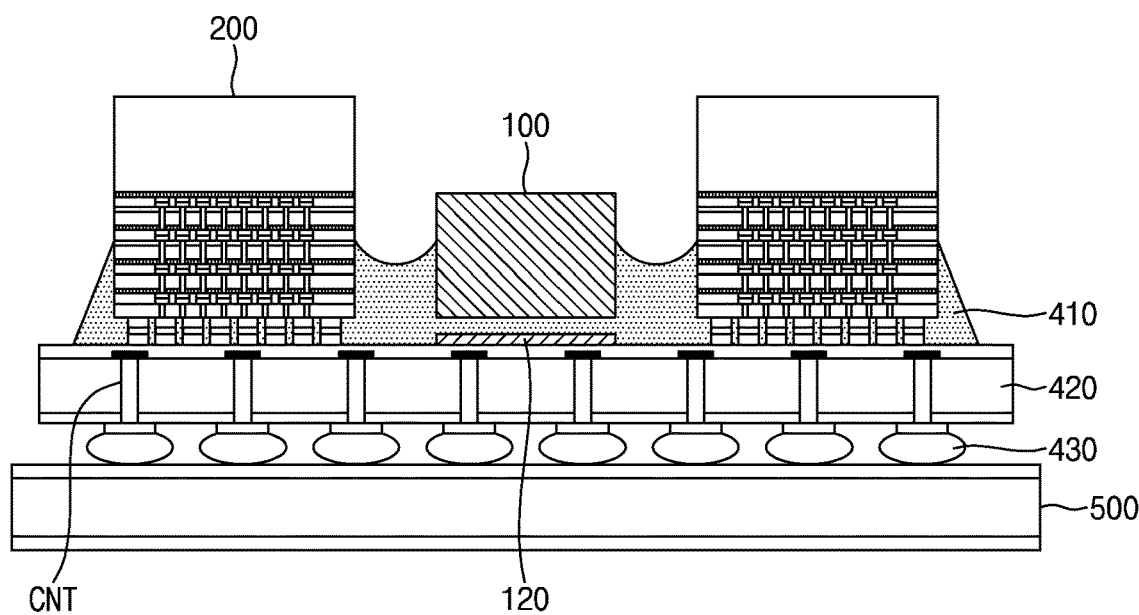
FIGS. 2A and 2B are cross-sectional views of the semiconductor chip module taken along line A1-A2 of FIG. 1.
Figure 2B:
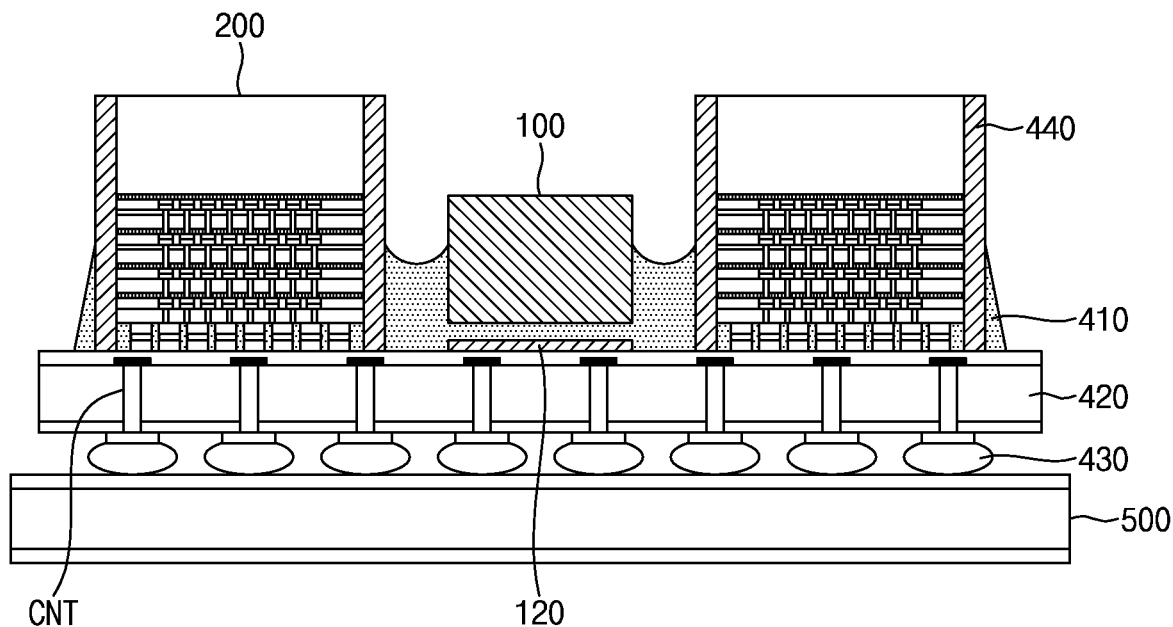
Figure 2C:
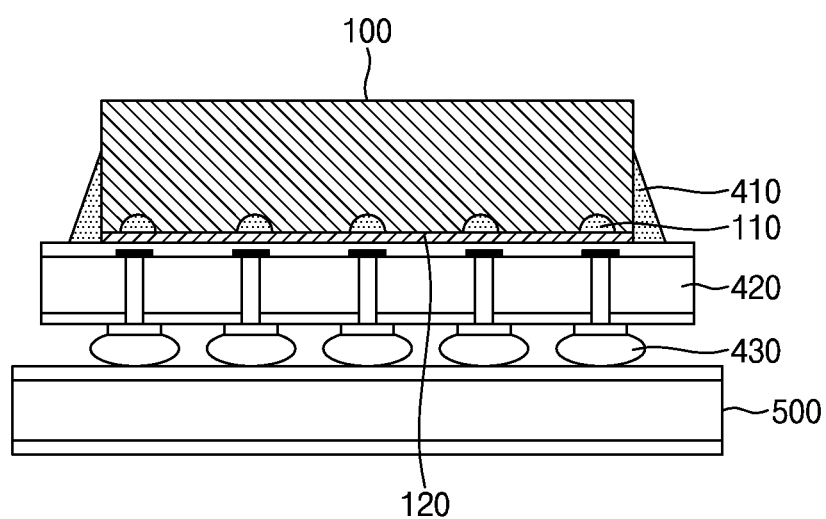
FIG. 2C is a cross-sectional view of the semiconductor chip module taken along line B1-B2 of FIG. 1.
Figure 2D:
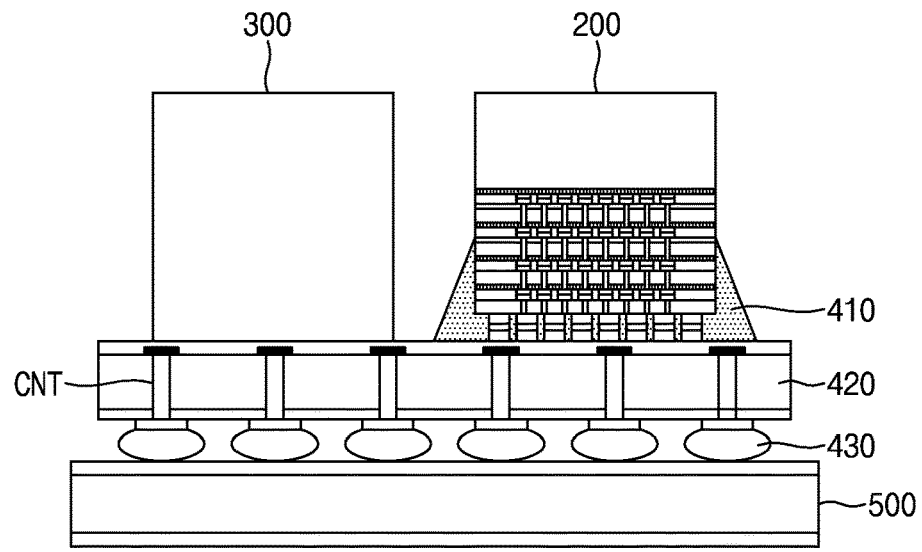
FIG. 2D is a cross-sectional view of the semiconductor chip module taken along line C1-C2 of FIG. 1.

Referring to FIGS. 1 to 2D, an example of a semiconductor chip module 10 according to the inventive concept includes a processor 300 disposed in the center of an interposer substrate 420, a plurality of active chips 200 disposed around the processor 300, a plurality of dummy chips 100 disposed in spaces between the plurality of active chips 200, and a printed circuit board (PCB) 500. The dummy chips 100, the active chips 200, and the processor 300 may be disposed on the interposer substrate 420. The PCB 500 may be disposed below the interposer substrate 420.

The semiconductor chip module 10 according to the inventive concept may include an epoxy resin 410 configured to package the plurality of active chips 200 and the plurality of dummy chips 100 and contact plugs CNT, bump pads, and bump joints 430, which are configured to electrically connect the interposer substrate 420 and the PCB 500. Circuits configured to drive the active chips 200 and the processor 300 may be disposed on the PCB 500.

A high-bandwidth memory (HBM) in which memories are stacked one on another in a chip stacking manner may be employed as the active chip 200. FIG. 1 illustrates an example in which two active chips 200 are disposed on each of left and right sides of the processor 300 using a 2.5D solution method. The dummy chips 100 may be disposed in spaces between the active chips 200 disposed adjacent to each other in a vertical direction in the figure (i.e., between the active chips 200 disposed adjacent to each other on each of the left and right sides of the processor). FIGS. 2A-2D illustrate an example in which each of the active chips 200 is a four-stack type of chip (has four independent memories or ICs stacked one above another). The inventive concept is not limited thereto, and the active chips 200 may each be a two-stack or an eight-stack or greater type of chip.

As shown in FIG. 2A, a chip package may be formed by at least one dummy chip 100, at least one active chip 200, and an epoxy resin 410 configured to package the at least one dummy chip 100 and the at least one active chip 200. As shown in FIG. 2B, an electromagnetic compatibility (EMC) layer 440 configured to protect the active chip 200 from the interference of electromagnetic waves may surround the active chip 200. The chip package may be electrically connected to the PCB 500 during a manufacturing process to form a semiconductor chip module 10. Each of a plurality of dummy chips 100 may be adhered to the upper portion of the interposer substrate 420 by an adhesive layer 120. A silicon substrate may be used as the interposer substrate 420.

The plurality of dummy chips 100 may be disposed in spaces between the active chips 200, and the epoxy resin 410 may fill spaces in and around the chips (to be described in more detail later on) to package the chips (help fix the chips to the interposer substrate 420 and protect the chips). During a manufacturing process, the interposer substrate 420 may be adhered to a carrier substrate (not shown) by an adhesive layer, and then transferred. The wafer in which the epoxy resin 410 packages the dummy chip 100 and the active chip 200 may be cut into units of chip packages. The chip package may be electrically connected to the PCB 500 by contact plugs CNT, bump pads, and bump joints 330 to form the semiconductor chip module 10.

In an example in which the active chips 200 are each a four-stack type, the height of the dummy chip 100 is half the height of an active chip 200. In an example in which the active chips 200 are each a two-stack type, the height of the dummy chip 100 is the same height as that of an active chip 200. In an example in which the active chips 200 are each an eight-stack type, the height of the dummy chip 100 may be half to a quarter of the height of an active chip 200.

Figure 3:
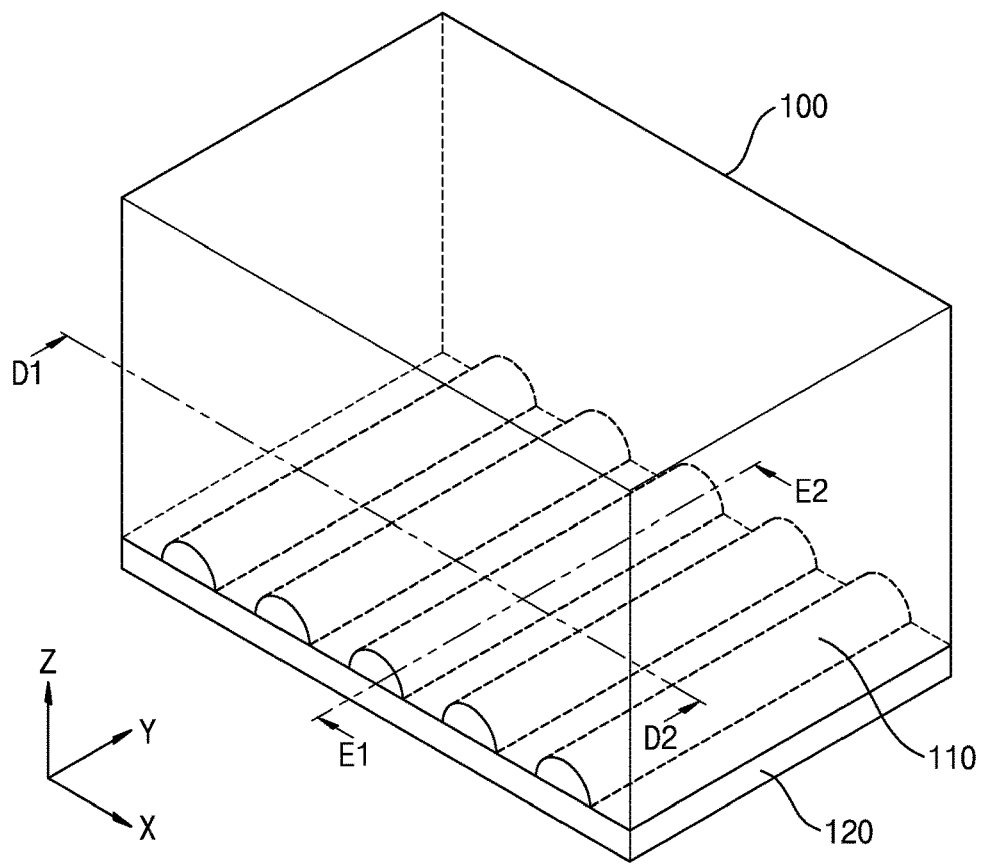
FIG. 3 is a diagram of a dummy chip of the semiconductor chip module shown in FIGS. 2A to 2C.
Figure 4A:
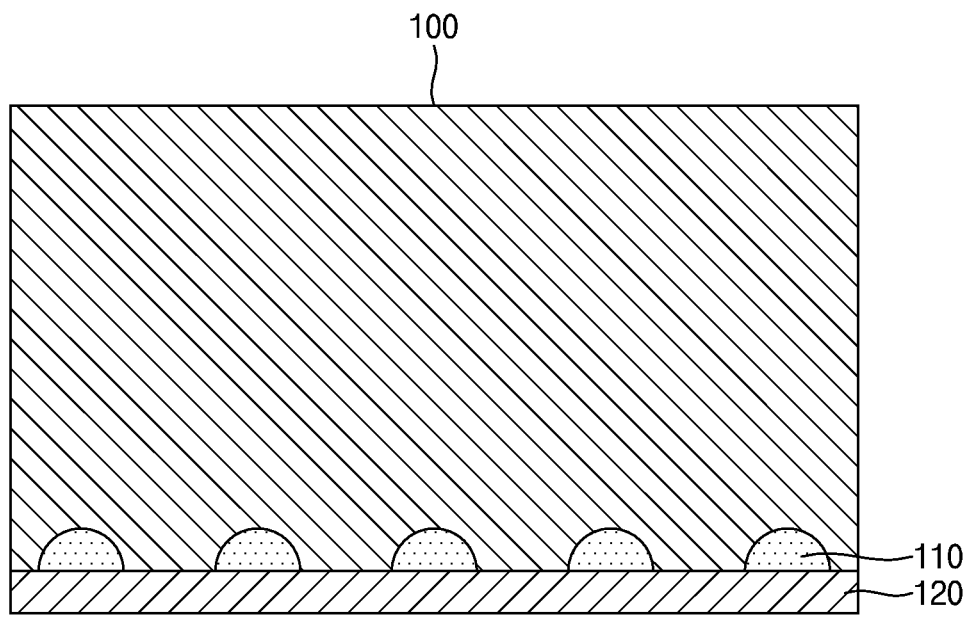
FIG. 4A is a cross-sectional view of the dummy chip, which is taken along line D1-D2 of FIG. 3.
Figure 4B:
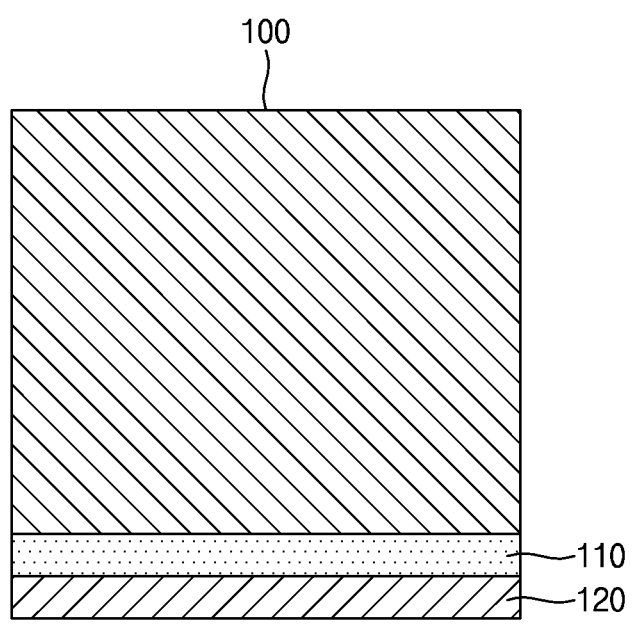
FIG. 4B is a cross-sectional view of the dummy chip, which is taken along line E1-E2 of FIG. 3.

FIG. 3 is a diagram of the dummy chip 100 shown in FIGS. 2A to 2C. FIG. 4A is a cross-sectional view of the dummy chip 100, which is taken along line D1-D2 of FIG. 3. FIG. 4B is a cross-sectional view of the dummy chip 100, which is taken along line E1-E2 of FIG. 3.

Referring to FIGS. 2A and 3 to 4B, warpage may occur in a chip package due to epoxy resin used to package the chips.

To control the warping of the chip package, according to an aspect of the inventive concept a plurality of tunnels may be formed in a dummy chip 100 and filled with the epoxy resin 410 to form a plurality of channels 110. A direction and extent of the warping of the chip package may be controlled according to the number and positions of the plurality of channels 110 formed in the dummy chip 100.

FIGS. 3 to 4B illustrate an example in which the channels 110 are formed in a lower end portion of the dummy chip 100. As shown in FIGS. 2A to 2C, tunnels in a body of the dummy chip 100 may be filled with the epoxy resin 410 to increase the force under which the dummy chip is fixed to the substrate 420 of the semiconductor chip module 10 or wafer in the packaging is carried out at a wafer level. In the case of the latter, the number and positions of the plurality of channels 110 formed in the dummy chip 100 may be the same across the wafer. That is, for a plurality of modules manufactured from one wafer, the dummy chips 100 will each have the same number of channels 110 formed at the same relative positions.

Figure 5A:
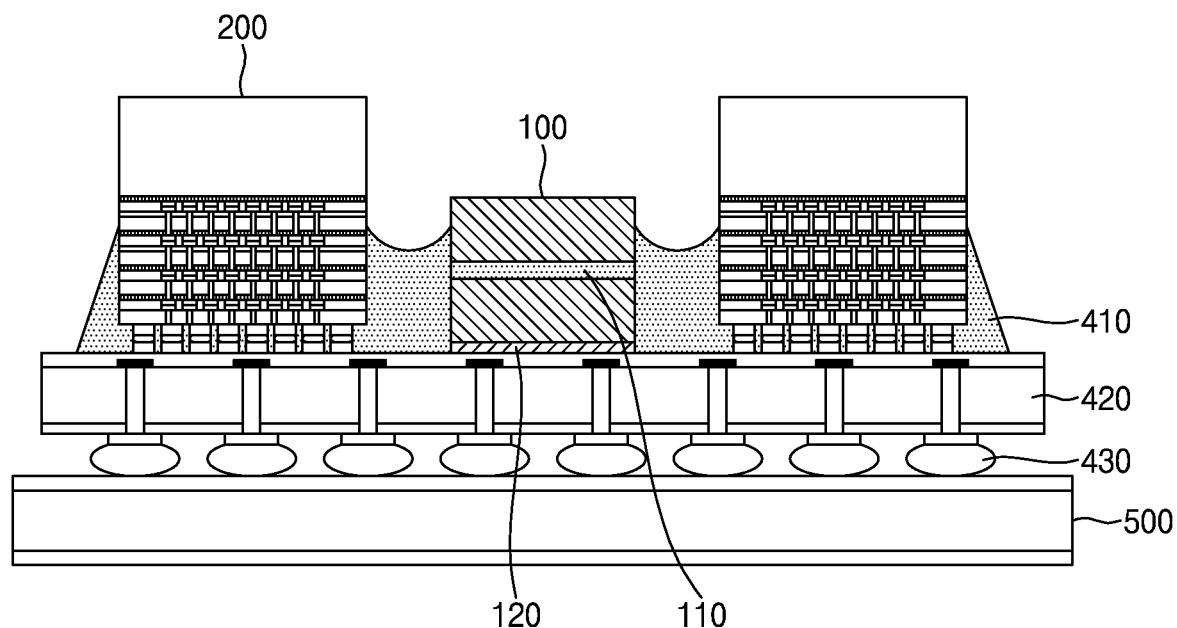
FIGS. 5A, 5B and 5C are cross-sectional views of a semiconductor module illustrating an example in which warping of a semiconductor chip is mitigated.
Figure 5B:
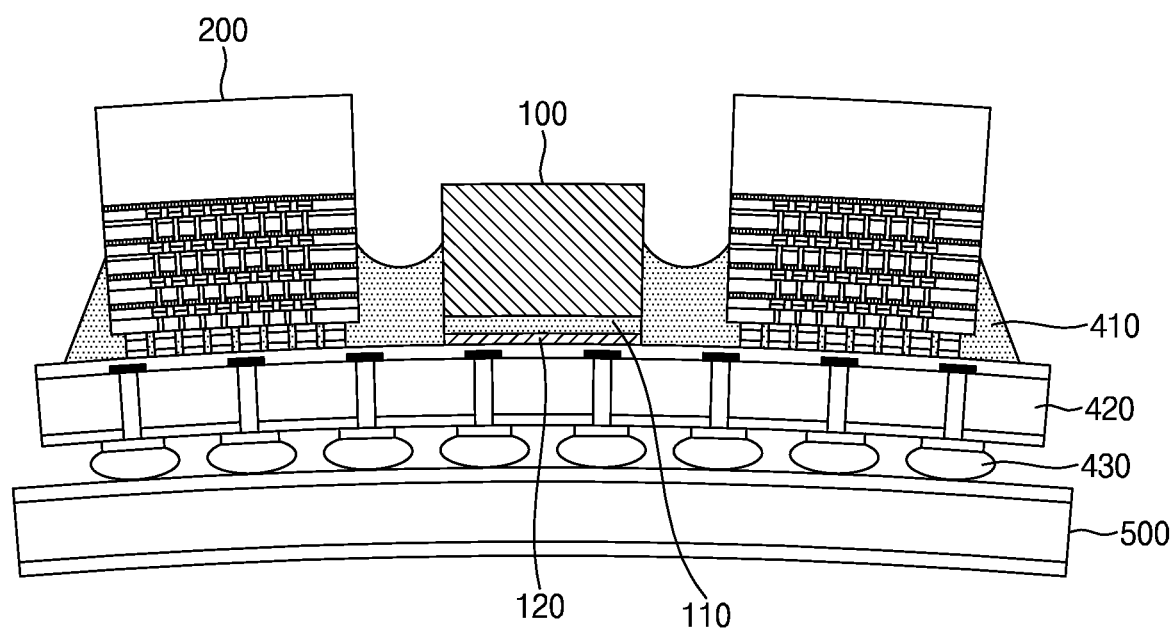
Figure 5C:
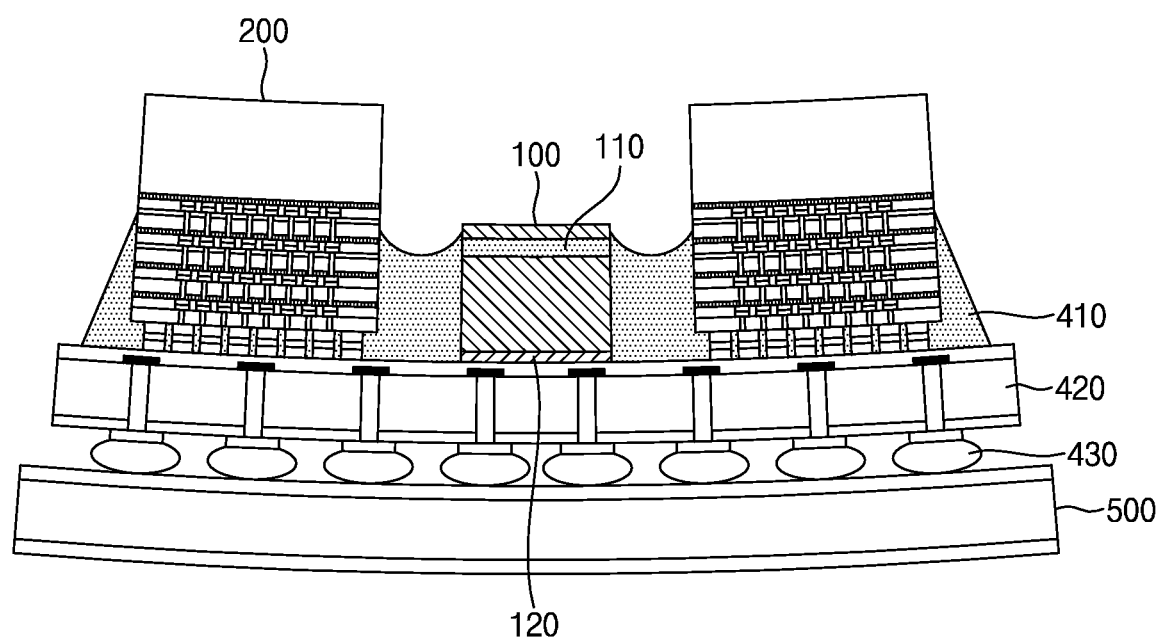

FIGS. 5A to 5C illustrate how a chip package is designed based on warpage of a PCB to mitigate warping in a chip module, in which the package is attached to the PCB, according to an aspect of the inventive concept.

The warping of the chip package may be controlled based on the number and positions of channels 110 formed in a lateral direction in a dummy chip 100. Three equal parts of the dummy chip 100 in a vertical direction will be considered, namely, a lower end (bottom) portion, a central portion, and an upper end (top) portion. In one example, the channel 110 is formed in one of the lower end (bottom) portion, the central portion, and the upper end (top) portion of the dummy chip 100. In another example, the channels 110 are formed in at least two of the portions from among the lower end (bottom) portion, the central portion, and the upper end (top) portion of the dummy chip 100.

Referring to FIG. 5A, when the PCB 500 is flat, the chip package bonded to the PCB 500 may also be formed so that the substrate of the chip package is flat. When the PCB 500 is flat, channels 110 extending in the lateral direction through the dummy chip 100 are formed in the central portion of the dummy chip 100. When an epoxy resin 410 is added to a wafer constituted by the substrate of the chip package to fix the chips to the wafer, tunnels formed through the central portion of the dummy chip 100 may also be filled with the epoxy resin 410. During a manufacturing process, the wafer may be cut to form a plurality of chip packages. In this case, the warping of the chip package may be prevented due to the channels 110 of epoxy resin 410 formed in the central portion of the dummy chip 100. In this way, the chip package is manufactured in consideration of the fact that the PCB 500 is not warped so that the PCB 500 may be smoothly bonded to the chip package. Accordingly, sufficient contact between the PCB 500 and the interposer substrate 420 is ensured, and manufacturing efficiency of the semiconductor chip module 10 is high.

Referring to FIG. 5B, if a PCB 500 is warped convexly, a chip package to be bonded to the PCB 500 may also be formed convexly to match the warpage of the PCB 500. When the PCB 500 warps convexly, channels 110 extending through a dummy chip 100 in a lateral direction are formed in a lower end portion of the dummy chip 100. That is, when an epoxy resin 410 is added to the wafer, the insides of the tunnels formed in the lower end portion of the dummy chip 100 may be also filled with the epoxy resin 410. During a manufacturing process, the wafer may be cut to form a plurality of chip packages. Due to the channels 110 of epoxy resin 410 formed in the lower end portion of the dummy chip 100, the chip packages may warp convexly. Accordingly, the PCB 500 may be smoothly bonded to the chip package. In this case, an extent to which the chip package warps convexly may be designed for by providing an appropriate number, height, and channel width of the plurality of channels 110. By controlling the warping of the chip package to essentially match that of the PCB in this way, sufficient contact between the PCB 500 and the interposer substrate 420 is ensured, and manufacturing efficiency of the semiconductor chip module 10 is high.

Referring to FIG. 5C, when the PCB 500 is warped concavely, the chip package bonded to the PCB 500 may also be formed concavely to the same extent as the PCB 500. In particular, when the PCB 500 warps concavely, channels 110 extending through the dummy chip 100 in a lateral direction may be formed in the upper end portion of the dummy chip 100. When the epoxy resin 410 is added to the wafer, the tunnels in the upper end portion of the dummy chip 100 may also be filled with the epoxy resin 410. During a manufacturing process, the wafer may be cut to form the plurality of chip packages. The chip package may warp convexly due to the forming of channels 110 of epoxy resin 410 in the upper end portion of the dummy chip 100. The chip package may be formed to warp concavely to essentially match the shape of the concavely warped PCB 500 so that the PCB 500 may be smoothly bonded to the chip package. In this case, the extent to which the chip package warps concavely may be designed for by providing an appropriate number, height, and channel width of the plurality of channels 110. By warping the chip package in this way, sufficient contact between of the PCB 500 and the chip package is ensured and manufacturing efficiency of the semiconductor chip module 10 high.

Figure 6A:
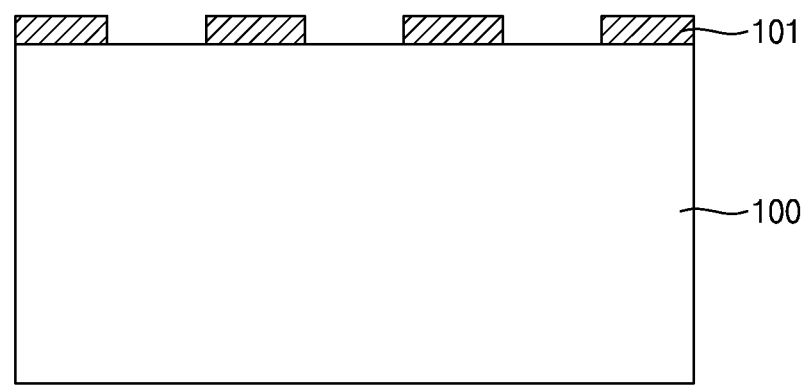
FIGS. 6A and 6B are cross-sectional views of a dummy chip during the course of its manufacture, illustrating a method of forming a channel according to the inventive concept.
Figure 6B:
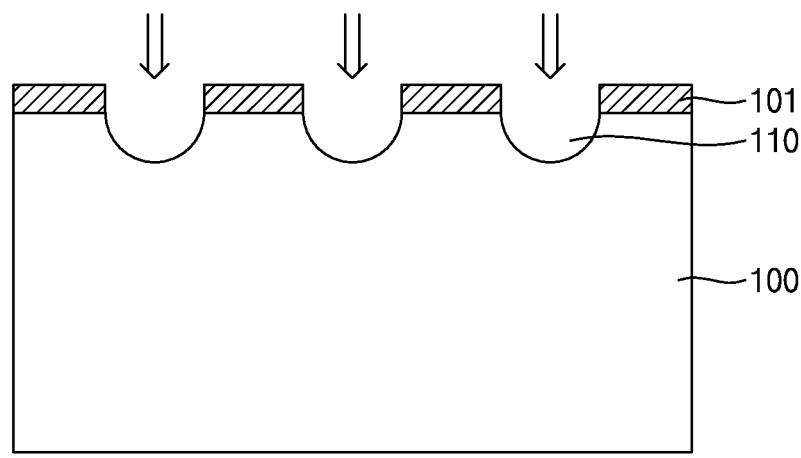

FIGS. 6A and 6B illustrate an example of a method of forming channels in a dummy chip, according to the inventive concept. More particularly, FIGS. 6A and 6B illustrate an example of a method of forming a plurality of channels 110 in a lower end portion of a dummy chip 100.

Referring to FIG. 6A, a mask 101 may be disposed on a body of a dummy chip 100. The body of the dummy chip may be a block of insulating material that is devoid of circuit elements (electronic components, wiring patterns, etc.). A first surface of the body of the dummy chip 100 may be coated with photoresist, and the photoresist may be selectively removed from a portion where the channels are to be formed, thereby forming the mask 101.

Referring to FIG. 6B, an isotropic etching process may be performed using the mask 101 to etch the body of the dummy chip 100 to a predetermined depth to form a plurality of tunnels open to sides of the body of the dummy chip 100. Here, for ease of understanding, the figures denote the channels 110 which are formed once the tunnels are filled. As an alternative to the etching process, the tunnels may be formed in the first surface of the dummy chip 100 using a drilling process.

Subsequently, as shown in FIG. 2A, an adhesive layer 120 may be formed on a first surface of the dummy chip 100 so that the dummy chip 100 may be adhered to an interposer substrate 420. That is, the plurality of tunnels may be formed in the lower end portion of the dummy chip 100, and the dummy chip 100 may be disposed (refer to FIG. 1) in a space between active chips 200. Subsequently, as shown in FIGS. 2A to 2C, an epoxy resin 410 may fill the tunnels in a state in which the active chips 200 and the dummy chip 100 are disposed on a wafer constituting the substrate 420. Thereafter, the wafer may be cut into units of chip packages, and an individual chip package may be bonded to a PCB 500 to produce a semiconductor chip module 10.

Figure 7A:
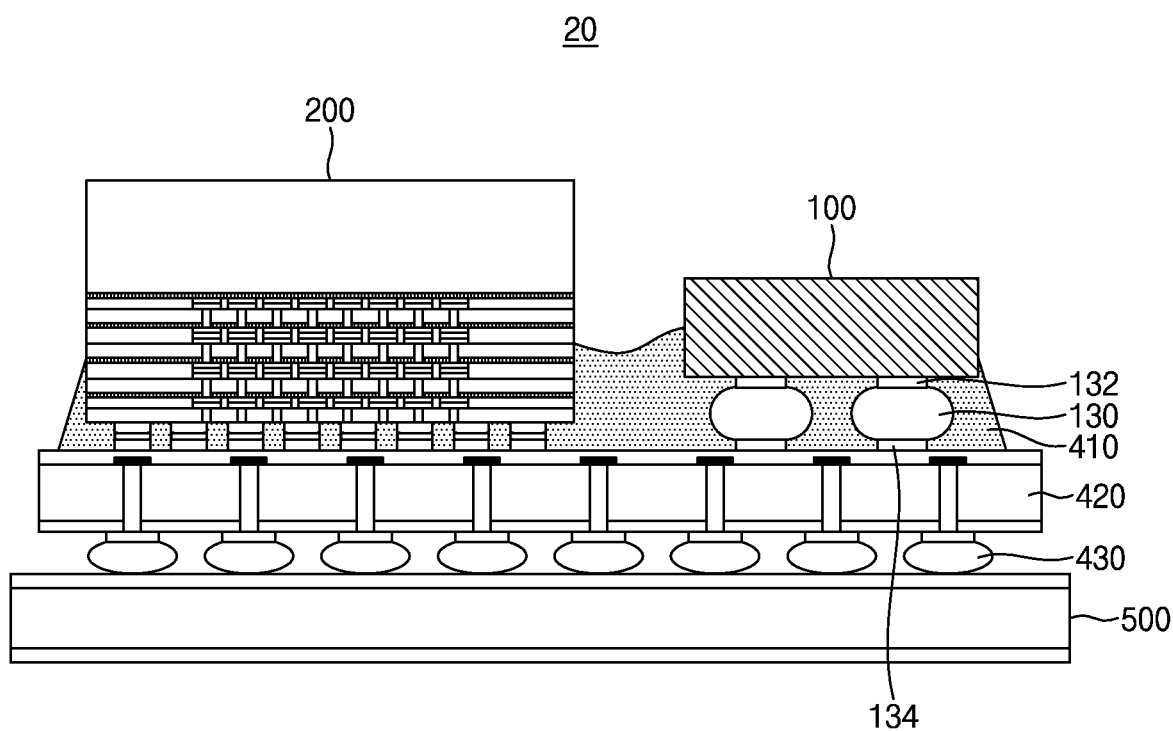
FIGS. 7A and 7B are cross-sectional views of other examples of a semiconductor chip module according to the inventive concept.
Figure 7B:
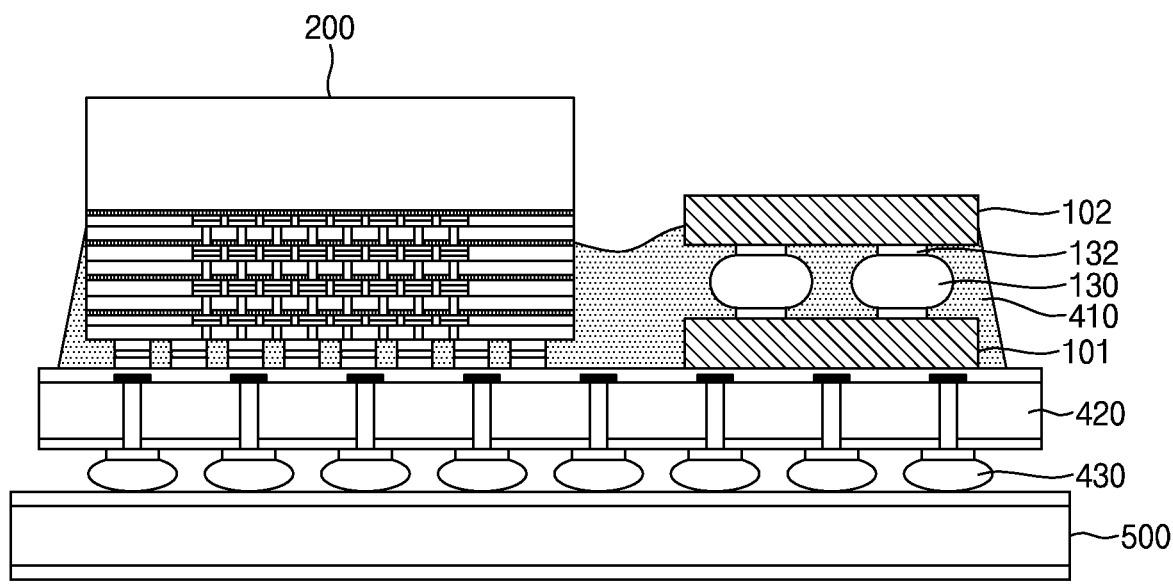

FIGS. 7A and 7B illustrate other examples of a semiconductor chip module 20 according to the inventive concept.

Referring to FIG. 7A, the semiconductor chip module 20 according to the inventive concept may include a processor 300 (refer to FIG. 1) disposed in the center of an interposer substrate 420, a plurality of active chips 200 disposed around the processor 300, a plurality of dummy chips 100 disposed in spaces between the plurality of active chips 200, and a PCB 500. The dummy chips 100, the active chips 200 and the processor 300 (refer to FIG. 1) may be disposed on the interposer substrate 420. The PCB 500 may be disposed below the interposer substrate 420. The semiconductor chip module 20 according to the inventive concept may include an epoxy resin 410 fixing the plurality of active chips 200 and the plurality of dummy chips 100 on the interposer substrate 420 (e.g., partially encapsulating the chips), and contact plugs CNT, bump pads, and bump joints 420 which electrically connect the interposer substrate 420 and the PCB 500. Circuits configured to drive the active chips 200 and the processor 300 may be disposed on the PCB 500.

Each of the plurality of dummy chips 100 may be fixed to an upper portion of the interposer substrate 420 by bump pads 132 and 134 and dummy bump joints 130. After the dummy chips 100 are disposed in spaces between the active chips 200, an epoxy resin 410 may added onto a wafer constituting the interposer substrate 420. The wafer may be cut into units of chip packages, and each chip package may be electrically connected to the PCB 500 to form the semiconductor chip module 20.

Empty spaces between the dummy bump joints 130 may be filled with the epoxy resin 410. That is, the spaces between the dummy bump joints 130 may function as tunnels that may be filled with the epoxy resin 410. The resulting channels formed in the spaces between the dummy bump joints 130 may be in the form of a lattice, which is open in horizontal X-axis and Y-axis directions. The channels may control (induce or prevent) warping of the chip package in the X-axis and Y-axis directions.

The spaces between the dummy bump joints 130 may be filled with the epoxy resin 410 to maximize the force by which chips are fixed in the chip package. When the wafer is cut into the units of the chip packages, warping of the chip packages may be prevented. The chip package may also be designed to warp according to the warpage of the PCB 500. When the PCB 500 is warped convexly, the chip package may also be designed to warp convexly. In this case, an extent to which the chip package warps convexly may be designed for by providing an appropriate number and size (e.g., width or height) of the plurality of dummy bump joints 130 disposed below the dummy chip 100. That is, the chip package may be produced as warped to the same extent as the PCB 500 so that the profile of chip package may be the same as that of the PCB 500. In this was, sufficient contact between the PCB 500 and the interposer substrate 420 may be ensured, and manufacturing efficiency of the semiconductor chip module 20 may be high.

Referring to FIG. 7B, a first dummy chip 101 and a second dummy chip 102 may be stacked one on the other, and a plurality of dummy bump joints 130 may be interposed between the second dummy chip 102 and the interposer substrate 420 and more particularly, between the second dummy chip 102 and the first dummy chip 101. The second dummy chip 102 may be fixed to an upper portion of the first dummy chip 101 by the bump pads 132 and 134 and the dummy bump joints 130. Empty spaces between the dummy bump joints 130 may be filled with the epoxy resin 410. The spaces between the dummy bump joints 130 may function as tunnels that may be filled with the epoxy resin 410. The first dummy chip 101 and the second dummy chip 102 may be considered collectively as a dummy chip having a chip body divided into upper and lower sections. Thus, resulting channels of the epoxy resin 410 may be considered as formed between an upper surface of the chip body of the second dummy chip 102 and the interposer substrate 42 or simply in a central portion of a chip body, in this example. The channels may be configured in the form of a lattice to control the extent of warping of the chip package in the X-axis and Y-axis directions.

Figure 8A:
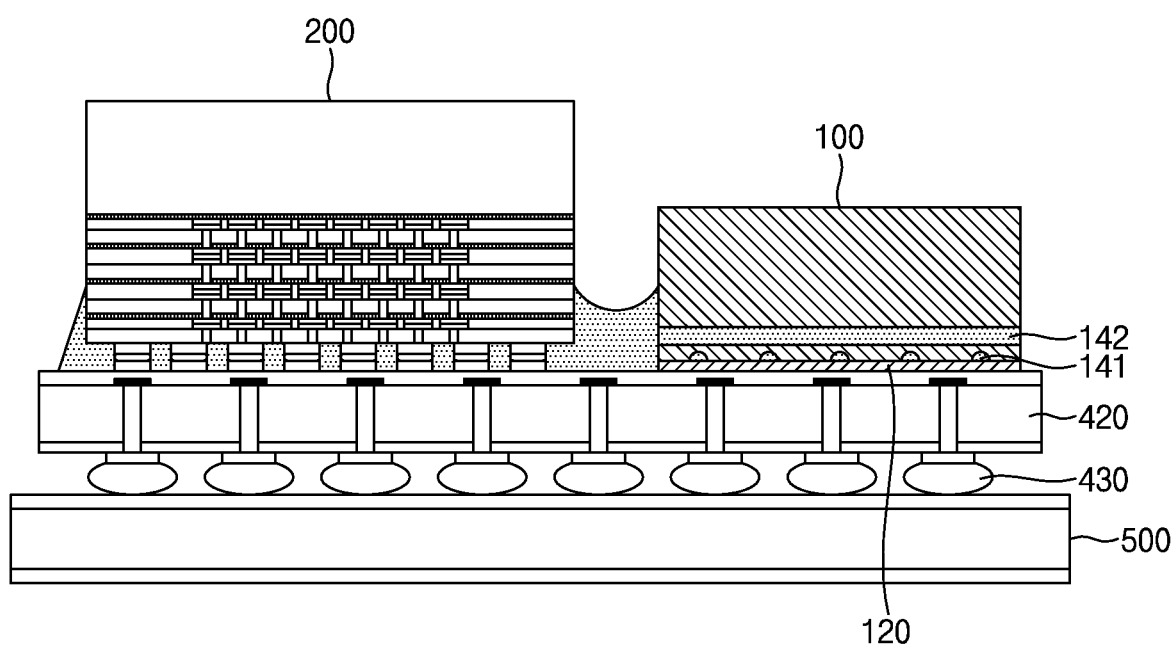
FIG. 8A is a cross-sectional view of still another example of a semiconductor chip module according to the inventive concept, in which channels are formed in different directions in a dummy chip.
Figure 8B:
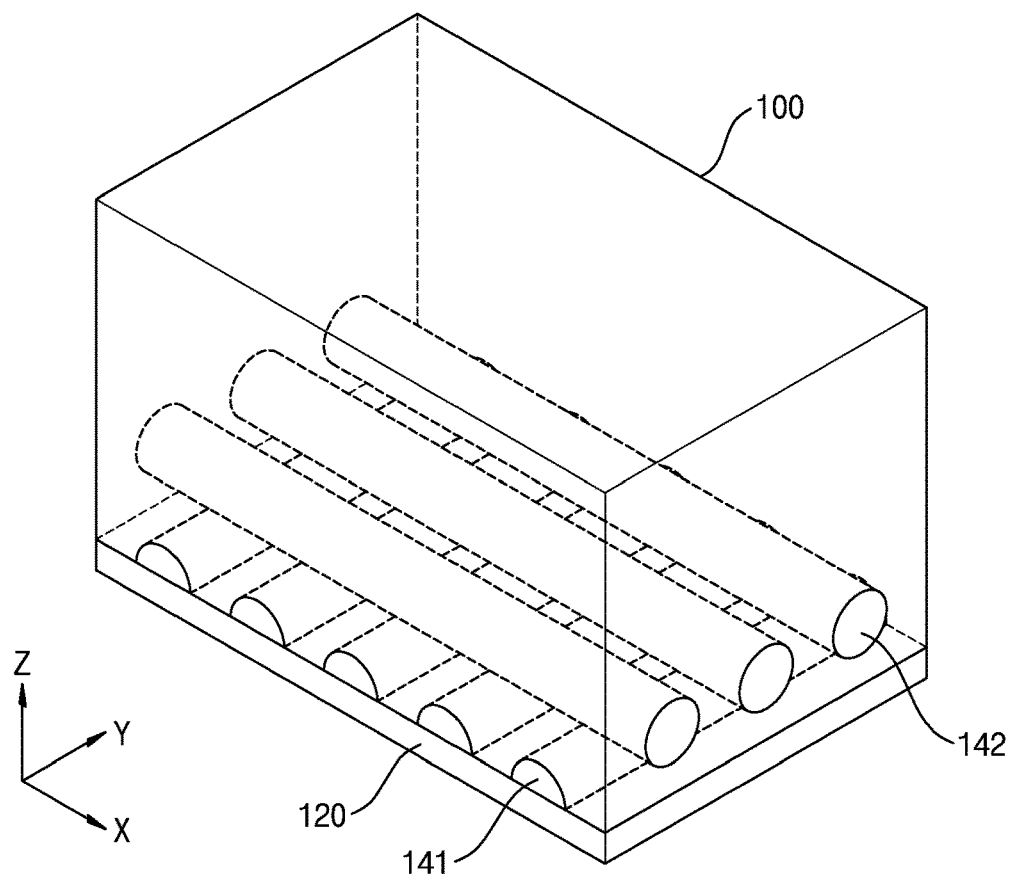
FIG. 8B is a perspective view of a dummy chip in which first channels are formed in a first direction and second channels are formed in a second direction in a lower end portion of the dummy chip.

FIGS. 8A and 8B illustrate an example embodiment of a semiconductor module in which channels are formed in different directions in a dummy chip.

Referring to FIGS. 8A and 8B, a direction and extent of the warping of the chip package may be controlled according to the numbers and positions of the plurality of channels 141 and 142 formed in the dummy chip 100. A plurality of first channels 141 may be formed in a first direction (e.g., Y-axis direction) in a bottom portion of the dummy chip 100. A plurality of second channels 142 may be formed in a second direction (e.g., X-axis direction) in the bottom portion of the dummy chip 100. The plurality of second channels 142 may be formed over the plurality of first channels 141. The plurality of first channels 141 and the plurality of second channels 142 may be formed through the dummy chip 100. The first channels 141 may extend longitudinally at a right angle to the second channels 142. The plurality of first channels 141 may be spaced a predetermined distance apart from the plurality of second channels 142 in a vertical (Z-axis) direction perpendicular to the first and second directions. The numbers and positions of the plurality of channels 141 and 142 formed in the dummy chip 100 may be the same in each wafer. That is, in the case of devices manufactured at a wafer level, the same numbers of channels 141 and 142 may be formed at the same relative positions in each of several dummy chips 100 fixed to the wafer and which will constitute respective chip packages when the wafer is cut.

The chip package may warp due to heat and pressure applied during the manufacturing process. The plurality of first channels 141 and the plurality of second channels 142 in the bottom portion of the dummy chip 100 may be specified to control and/or mitigate warping of the chip package that tends occur.

In an example, when a PCB to be bonded to the chip package is warped convexly, the chip package may be designed to warp in conformance with the warpage of the PCB. To this end, in the bottom portion of the dummy chip 100, the plurality of first channels 141 may be formed in the first direction (e.g., Y-axis direction), and the plurality of second channels 142 may be formed in the second direction (e.g., X-axis direction). The plurality of first channels 141 formed in the bottom portion of the dummy chip 100 in the first direction may cause the chip package to warp convexly in the first direction (Y-axis direction). The plurality of second channels 142 formed in the lower end portion of the dummy chip 100 may cause the chip package to warp convexly in the second direction (X-axis direction).

Thus, (the interposer substrate 420 of) the chip package may be made to warp convexly in the same way as the PCB so that the PCB may be smoothly bonded to the chip package. In this case, an extent to which the chip package warps convexly may be established by specifying an appropriate number, height, and channel width of the plurality of first channels 141 and the plurality of second channels 142. By inducing a controlled for warping of the chip package, sufficient contact between the PCB and the chip package may be ensured and manufacturing efficiency of a module of the semiconductor chip may be high.

Figure 9A:
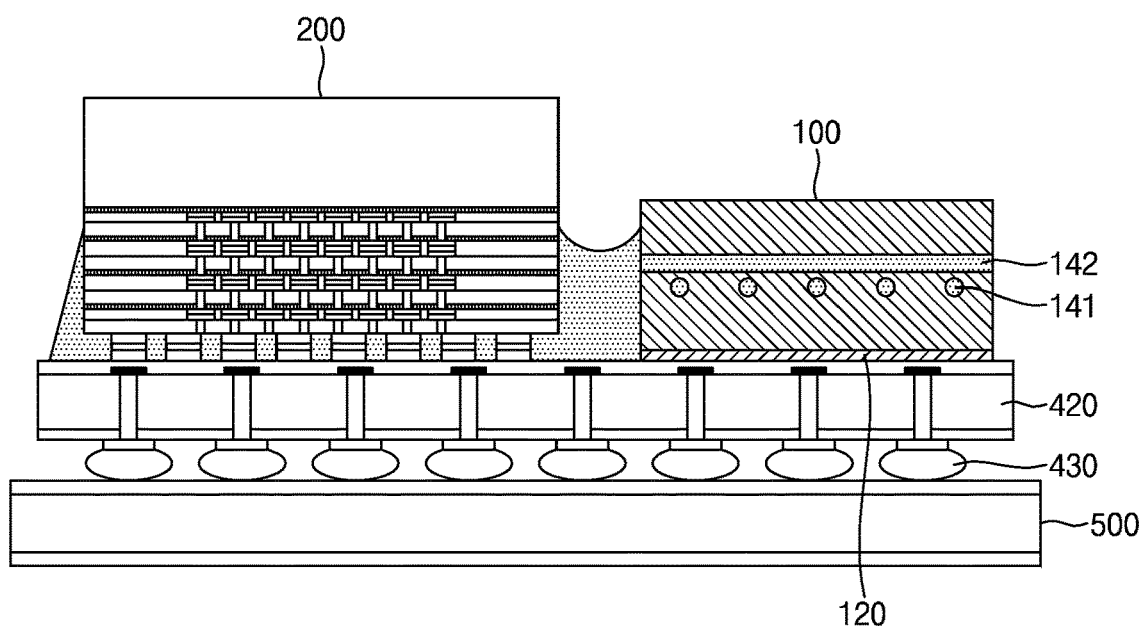
FIG. 9A is a cross-sectional view of an example of a semiconductor chip module according to the inventive concept, in which channels are formed in different directions in a dummy chip.
Figure 9B:
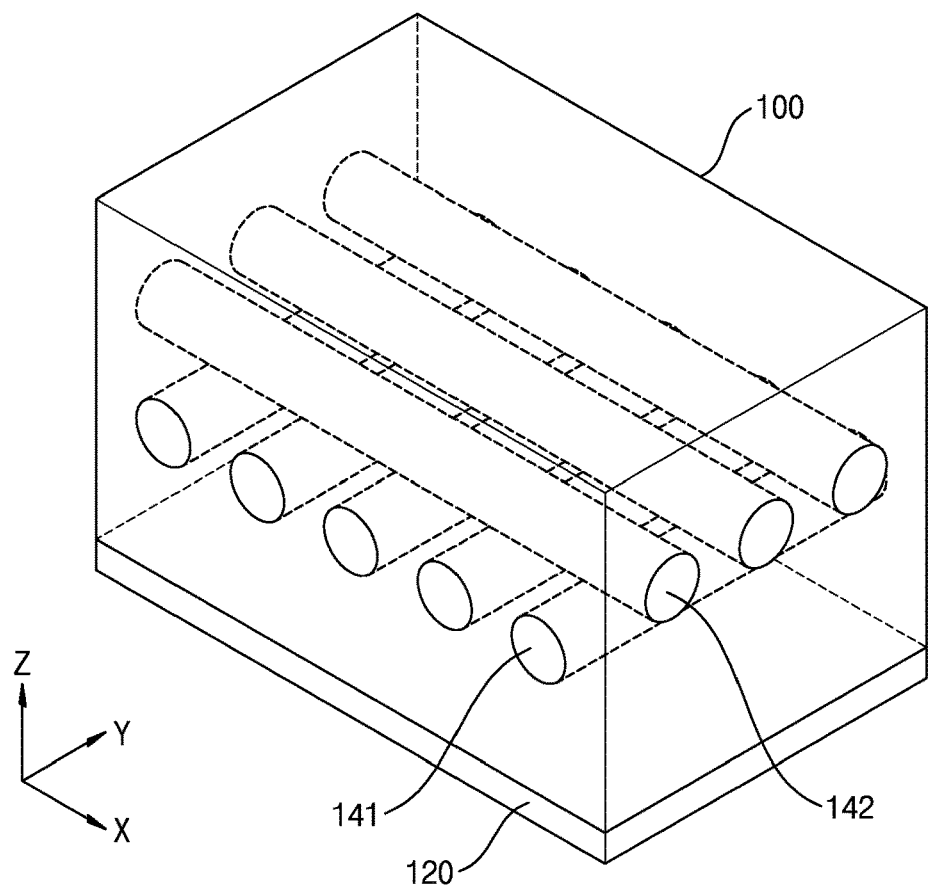
FIG. 9B is a perspective view of a dummy chip in which first channels are formed in a first direction and second channels are formed in a second direction in a central portion of a dummy chip.

FIGS. 9A and 9B illustrate an example of a semiconductor chip module according to the inventive concept, in which channels are formed in different directions in a central portion of the dummy chip.

Referring to FIGS. 9A and 9B, to prevent the chip package from warping a plurality of first channels 141 may be formed in a first direction (e.g., Y-axis direction) and a plurality of second channels 142 may be formed in a second direction (e.g., X-axis direction), in a central portion of a dummy chip 100. The plurality of second channels 142 may be formed over the plurality of first channels 141. The plurality of first channels 141 and the plurality of second channels 142 may be formed through the dummy chip 100. The plurality of first channels 141 may each extend axially (longitudinally) at a right angle to each of the plurality of second channels 142. The plurality of first channels 141 may be spaced a predetermined distance apart from the plurality of second channels 142 in a direction (Z-axis) perpendicular to the upper surface of the interposer substrate 420.

When a PCB to be bonded to the chip package is flat, the chip package may be produced to be flat in conformance with the PCB. To this end, the plurality of first channels 141 may be formed in the first direction (Y-axis direction) and the plurality of second channels 142 may be formed in the second direction (X-axis direction), in the central portion of the dummy chip 100. The plurality of first channels 141 formed in the central portion of the dummy chip 100 can prevent the chip package from being produced as warped in the first direction. The plurality of second channels 142 formed in the central portion of the dummy chip 100 can prevent the chip package from being produced as warped in the second direction.

Thus, (the interposer substrate 420 of) the chip package may be flat like the PCB so that the PCB may be smoothly bonded to the chip package. In this case, the numbers, heights, and channel widths of the plurality of first channels 141 and the plurality of second channels 142 may be appropriately designed for so that the chip package may be flat. Accordingly, sufficient contact between the PCB and the chip package may be ensured, and manufacturing efficiency of the semiconductor chip module may be high.

Figure 10A:
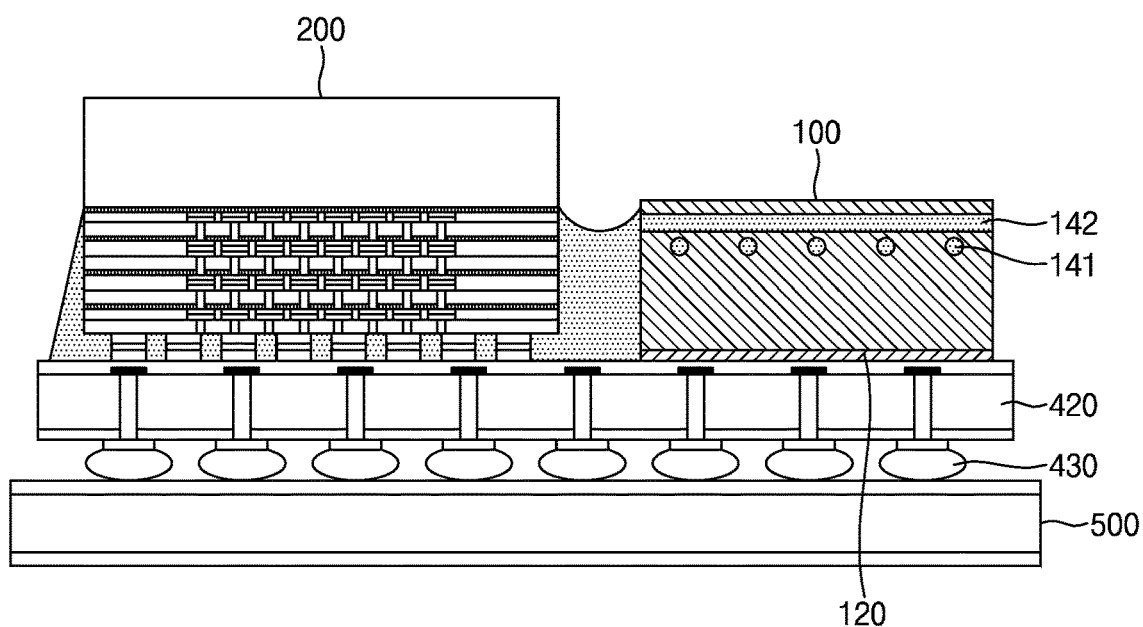
FIG. 10A is a cross-sectional view of an example of a semiconductor chip module according to the inventive concept, in which channels are formed in different directions in a dummy chip.
Figure 10B:
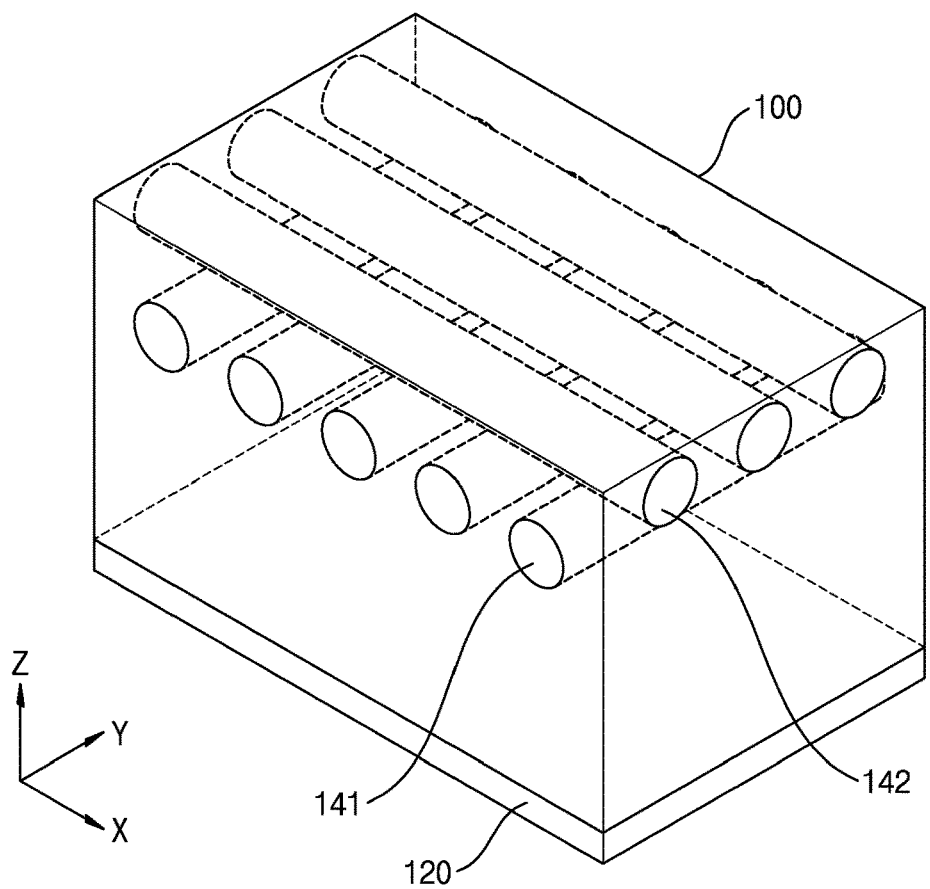
FIG. 10B is a perspective view of a dummy chip in which first channels are formed in a first direction and second channels are formed in a second direction in an upper end portion of a dummy chip.

FIGS. 10A and 10B illustrate an example of a semiconductor chip module according to the inventive concept, in which channels are formed in different directions in a top portion of a dummy chip.

Referring to FIGS. 10A and 10B, a plurality of first channels 141 may be formed in a first direction (Y-axis direction) and a plurality of second channels 142 may be formed in a second direction (X-axis direction) in an upper end portion of a dummy chip 100. The plurality of second channels 142 may be formed over the plurality of first channels 141. The plurality of first channels 141 and the plurality of second channels 142 may extend through the dummy chip 100. The first channels 141 may extend longitudinally at a right angle to the second channels 142. The plurality of first channels 141 may be spaced a predetermined distance apart from the plurality of second channels 142 in a direction (Z-axis) perpendicular to the upper surface of the interposer substrate 420.

In an example, when a PCB to be bonded to the chip package is warped concavely, (the substrate 420 of) the chip package may be warped to conform to the warpage of the PCB owing to the plurality of first channels 141 and the plurality of second channels 142 may be formed in the second direction. In particular, the plurality of first channels 141 of epoxy resin 410 formed in the top portion of the dummy may cause the chip package to warp concavely in the first direction (Y-axis direction). The plurality of second channels 142 of epoxy resin 410 formed in the top portion of the dummy chip 100 may cause the chip package to warp in the second direction (X-axis direction).

Because the chip package is produced to warp concavely to the same extent as the concavely warped PCB, the PCB may be smoothly bonded to the chip package. The numbers, heights, and channel widths of the plurality of first channels 141 and the plurality of second channels 142 may be specified to establish the extent to which the chip package warps concavely. By so controlling the warping of the chip package, sufficient contact between the PCB and the chip package may be ensured, and manufacturing efficiency of the semiconductor chip module may be high.

Figure 11A:
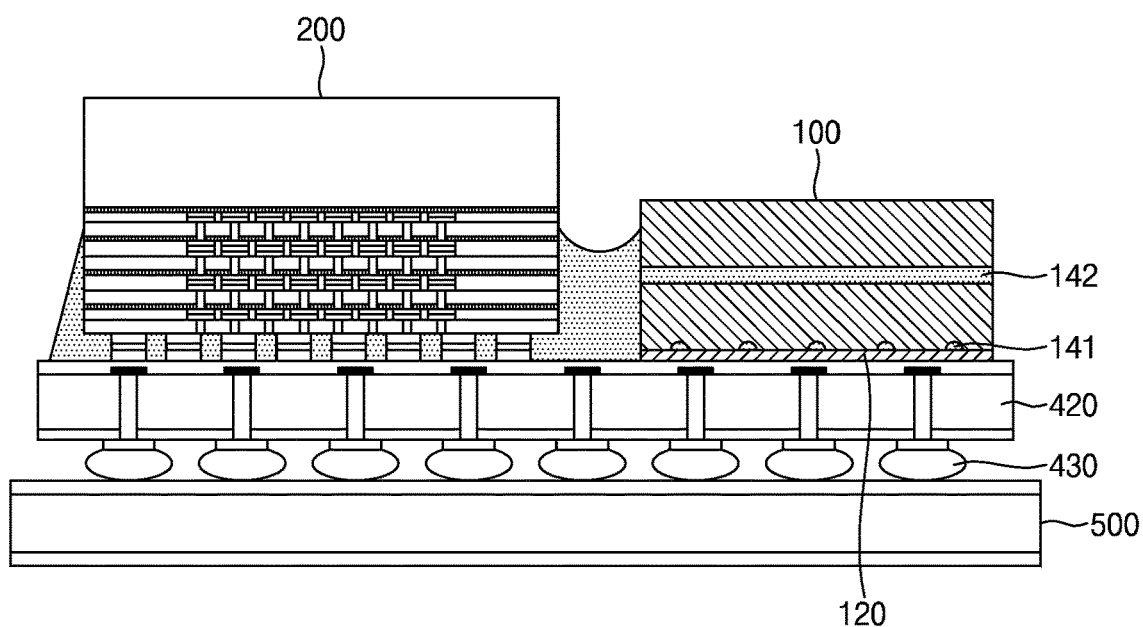
FIG. 11A is a cross-sectional view of an example of a semiconductor chip module according to the inventive concept, in which first channels are formed in a lower end portion of a dummy chip in a first direction and second channels are formed in a central portion of the dummy chip in a second direction.

FIG. 11A illustrates an example of a semiconductor chip module according to the inventive concept, in which channels are formed in a bottom portion and in a central portion of the dummy chip.

Referring to FIG. 11A, a plurality of first channels 141 of the epoxy resin 410 may be formed in the bottom portion of the dummy chip 100 in a first direction (Y-axis direction). A plurality of second channels 142 of the epoxy resin 410 may be formed in the central portion of the dummy chip 100 in a second direction (X-axis direction). The plurality of first channels 141 and the plurality of second channels 142 may be formed through the dummy chip 100. The plurality of first channels 141 may be formed to extend longitudinally at a right angle to the plurality of second channels 142. The plurality of first channels 141 may be spaced a predetermined distance apart from the plurality of second channels 142 in a vertical (Z-axis) direction.

The plurality of first channels 141 of the epoxy resin 410 may induce a controlled amount of warpage (of the substrate 420) of the chip package in the first direction (Y-axis direction). The plurality of second channels 142 of the epoxy resin 410 may control the extent to which the chip package warps in the second direction (X-axis direction).

Figure 11B:
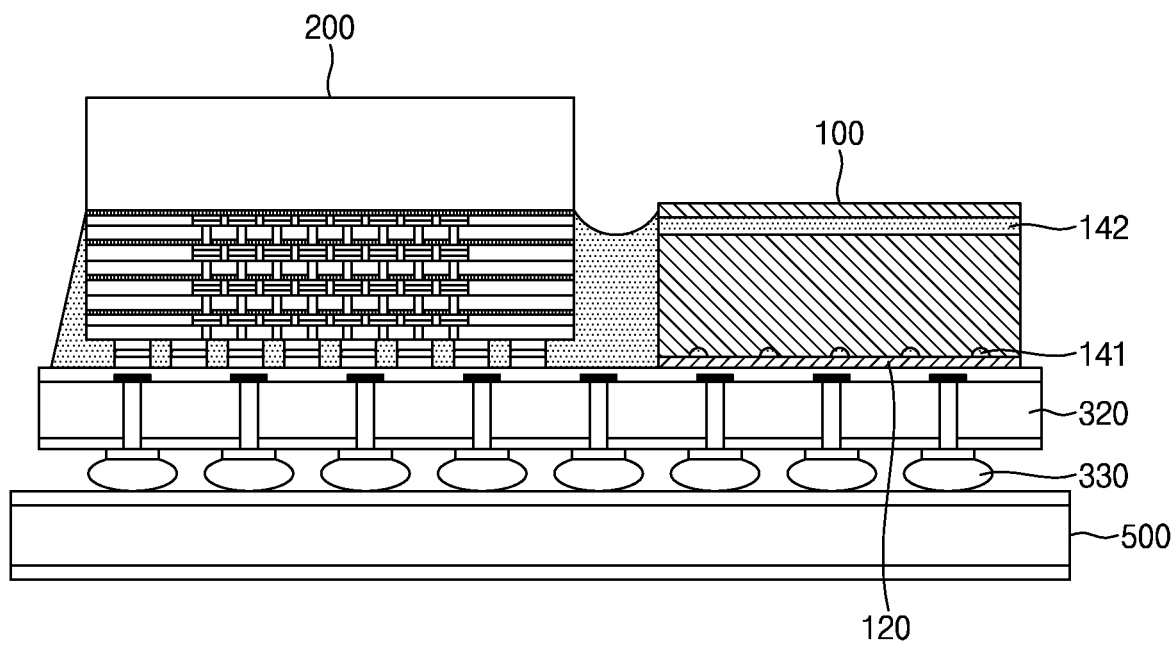
FIG. 11B is a cross-sectional view of an example of a semiconductor chip module according to the inventive concept, in which first channels are formed in a first direction in a lower end portion of a dummy chip and second channels are formed in a second direction in an upper end portion of the dummy chip.

FIG. 11B illustrates an example of a semiconductor chip module according to the inventive concept, in which channels are formed in a bottom portion and in a top portion of the dummy chip.

Referring to FIG. 11B, a plurality of first channels 141 of the epoxy resin 410 may be formed in the bottom portion of the dummy chip 100 in a first direction (e.g., Y-axis direction). A plurality of second channels 142 of the epoxy resin 410 may be formed in the top portion of the dummy chip 100 in a second direction (X-axis direction). The plurality of first channels 141 and the plurality of second channel 142 may be formed through the dummy chip 100. The plurality of first channels 141 may extend longitudinally at a right angle to the plurality of second channels 142. The plurality of first channels 141 may be spaced a predetermined distance apart from the plurality of second channels 142 in a vertical (Z-axis) direction.

The plurality of first channels 141 may induce a controlled amount of warping (in the substrate 420 of) the chip package in the first direction (Y-axis direction). The plurality of second channels 143 may induce a controlled amount of warping (in the substrate 420 of) the chip package in the second direction (X-axis direction).

Figure 11C:
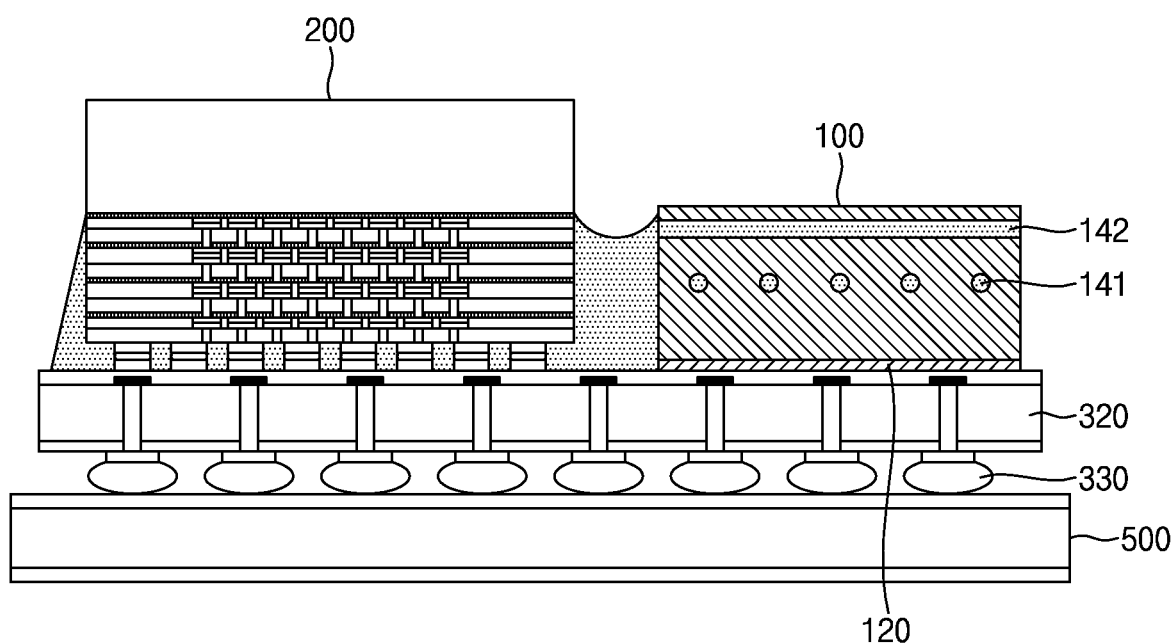
FIG. 11C is a cross-sectional view of an example of a semiconductor chip module according to the inventive concept, in which first channels are formed in a first direction in a central portion of a dummy chip, and second channels are formed in a second direction in an upper end portion of the dummy chip.

FIG. 11C illustrates an example of a semiconductor chip module according to the inventive concept, in which channels are formed in a central portion and in a top portion of the dummy chip.

Referring to FIG. 11C, a plurality of first channels 141 of the epoxy resin 410 may be formed in the central portion of the dummy chip in a first direction (Y-axis direction). A plurality of second channels 142 of the epoxy resin 410 may be formed in the top portion of the dummy chip 100 in a second direction (X-axis direction). The plurality of first channels 141 and the plurality of second channels 142 may be formed through the dummy chip 100. The plurality of first channels 141 may extend longitudinally at a right angle to the plurality of second channels 142. The plurality of first channels 141 may be spaced a predetermined distance apart from the plurality of second channels 142 in a vertical (Z-axis) direction.

The plurality of first channels 141 may control the warping of the chip package in the first direction (e.g., Y-axis direction). The plurality of second channels 142 may induce a controlled amount of warping in (the substrate 420 of) the chip package in the second direction (e.g., X-axis direction).

Figure 12A:
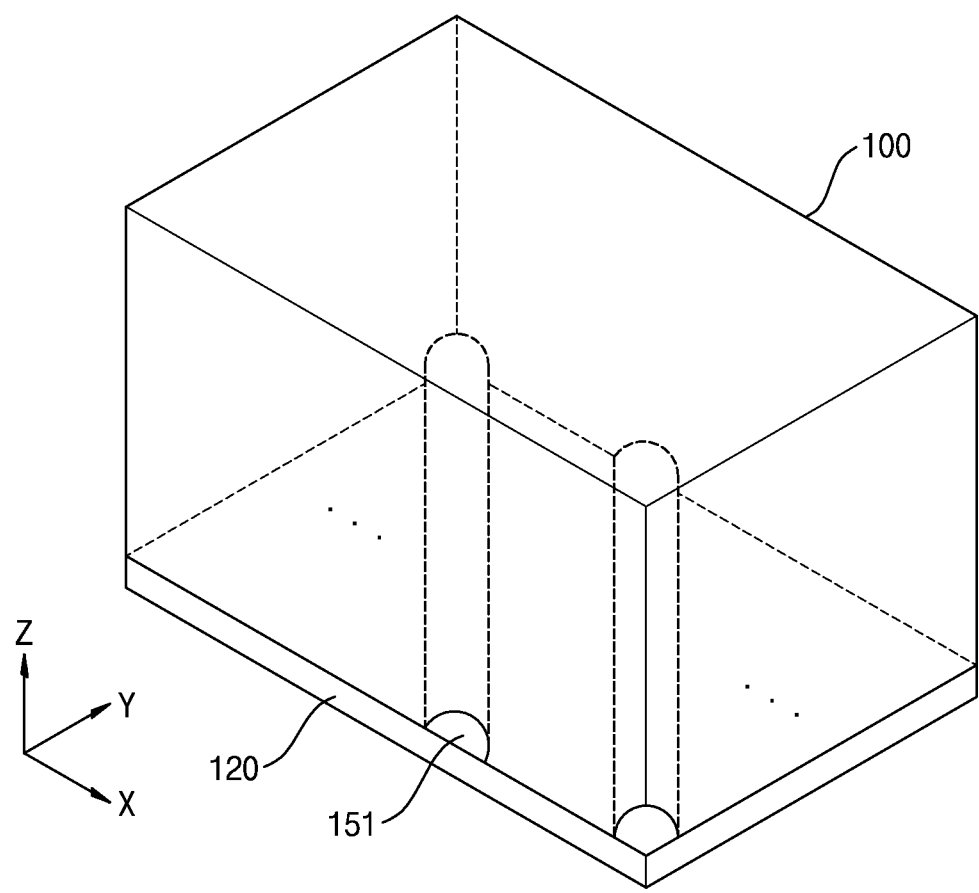
FIG. 12A is a perspective view of a dummy chip in which channels are formed in a diagonal direction in a lower end portion of a dummy chip.
Figure 12B:
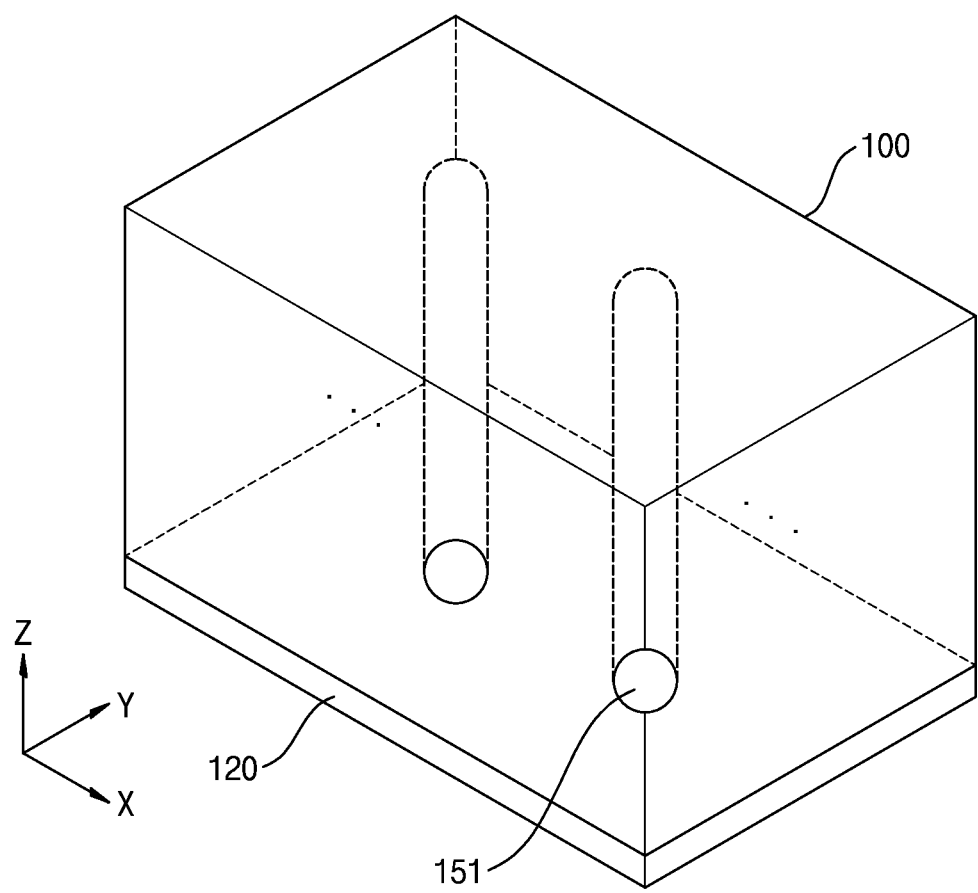
FIG. 12B is a perspective view of a dummy chip in which channels are formed in a diagonal direction in a central portion of a dummy chip.
Figure 12C:
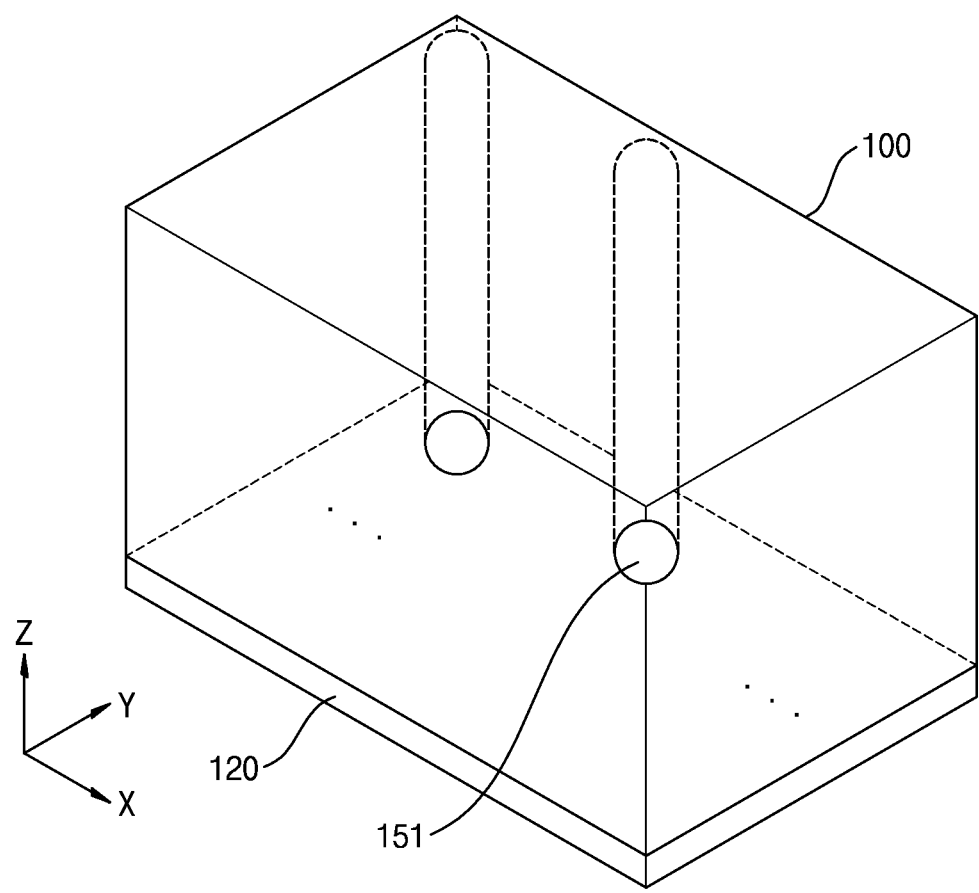
FIG. 12C is a perspective view of a dummy chip in which channels are formed in a diagonal direction in an upper end portion of a dummy chip.

FIGS. 12A-12C illustrate other examples of dummy chips of a chip package of a chip module, according to the inventive concept, in which channels are formed in a diagonal direction in the dummy chip, i.e., in a direction that is oblique with respect to sides of the dummy chip. Reference may be made to FIGS. 1 and 2A-2D for certain features described but not shown in these figures.

Referring to FIG. 12A, a plurality of channels 151 of the epoxy resin 410 (not shown) may be formed in a diagonal direction in the bottom portion of a dummy chip 100. The plurality of channels 151 may be formed through the dummy chip 100. The plurality of channels 151 may in induce a controlled amount of warping in (the substrate 420 of) the chip package in an X-axis direction and a Y-axis direction. In particular, when a PCB to be bonded to the chip package is warped convexly, the plurality of channels 151 may induce warpage in the chip package in conformance with the PCB.

Referring to FIG. 12B, a plurality of channels 151 of the epoxy resin 410 (not shown) may be formed in a diagonal direction in the central portion of the dummy chip 100. The plurality of channels 151 may be formed through the dummy chip 100. Thus, the plurality of channels 151 may control warping of the chip package in an X-axis direction and a Y-axis direction. When a PCB bonded to the chip package is substantially flat, i.e., is not warped, the plurality of channels 151 in the central portion of the dummy chip 100 may prevent warping (of the substrate 420) of the chip package so that the substrate 420 of the chip package is as flat as the PCB.

Referring to FIG. 12C, a plurality of channels 151 of the epoxy resin 410 may be formed in a diagonal direction in a top portion of a dummy chip 100. The plurality of channels 151 may be formed through the dummy chip 100. Thus, the plurality of channels 151 may control warping of the chip package in an X-axis direction and a Y-axis direction. When a PCB to be bonded to the chip package is warped convexly, the plurality of channels 151 may induce warpage in (the substrate 420 of) the chip package in conformance with that of the PCB.

The inventive concept is not limited to a chip module having dummy chips as particularly described above.

In another example, in each dummy chip 100 of the chip package, a plurality of first channels of the epoxy resin extend in a horizontal direction perpendicular to sides of the dummy chip (the X-axis or Y-axis direction) and a plurality of second channels of the epoxy resin extend in a diagonal direction, all in the bottom portion of the dummy chip 100. The first channels and the second channels may be formed through the dummy chip 100. The plurality of first channels may be spaced a predetermined distance apart from the plurality of second channels in the vertical (Z-axis) direction.

Thus, when the PCB to be bonded to the chip package is warped convexly, (the substrate 420 of) the chip package may be warped in conformity with the warpage of the PCB.

In another example, in each dummy chip 100 of the chip package, a plurality of first channels extend in a horizontal direction perpendicular to sides of the dummy chip (the X-axis or Y-axis direction) and a plurality of second channels extend in a diagonal direction, all in the central portion of the dummy chip. The first channels and the second channels may be formed through the dummy chip 100. The plurality of first channels may be spaced a predetermined distance apart from the plurality of second channels in a vertical (Z-axis) direction.

Thus, when the PCB to bonded to the chip package is substantially flat, the plurality of first channels and the plurality of second channels formed in the central portion of the dummy chip 100 may keep (the substrate of) the chip package flat especially in the X-axis or Y-axis direction and the diagonal direction, thereby enabling a smooth bonding between the chip package and the PCB.

In still another example, in each dummy chip 100 of the chip package, a plurality of first channels of the epoxy resin extend in a horizontal direction perpendicular to sides of the dummy chip (the X-axis or Y-axis direction) and a plurality of second channels of the epoxy resin extend in a diagonal direction, all in the top portion of the dummy chip 100. The first channels and the second channels may be formed through the dummy chip 100. The plurality of first channels may be spaced a predetermined distance apart from the plurality of second channels in a vertical (Z-axis) direction.

Thus, when a PCB bonded to the chip package is warped concavely, (the substrate 420 of) of the chip package may be warped in conformity with the warpage of the PCB.

In still another example, in each dummy chip 100 of the chip package, a plurality of first channels of epoxy resin extend longitudinally through the dummy chip 100 in a first diagonal direction and a plurality of second channels extend longitudinally through the dummy chip 100 in a second diagonal direction at a right angle to the first diagonal direction.

In these examples described above, according to an aspect of the inventive concept, the dummy chips of the chip package can be designed to induce or mitigate warping in or of the substrate of the chip package in the X-axis direction or the Y-axis direction and in diagonal directions, or in different diagonal directions. In particular, the extent to which the chip package warps when produced may be designed for by specifying the numbers, heights, and channel widths of the plurality of first channels formed in the Y-axis, X-axis or a diagonal direction and the plurality of second channels formed in the diagonal direction. Accordingly, sufficient contact between the PCB and the chip package may be ensured, and manufacturing efficiency of a semiconductor chip module may be increased.

Figure 13:
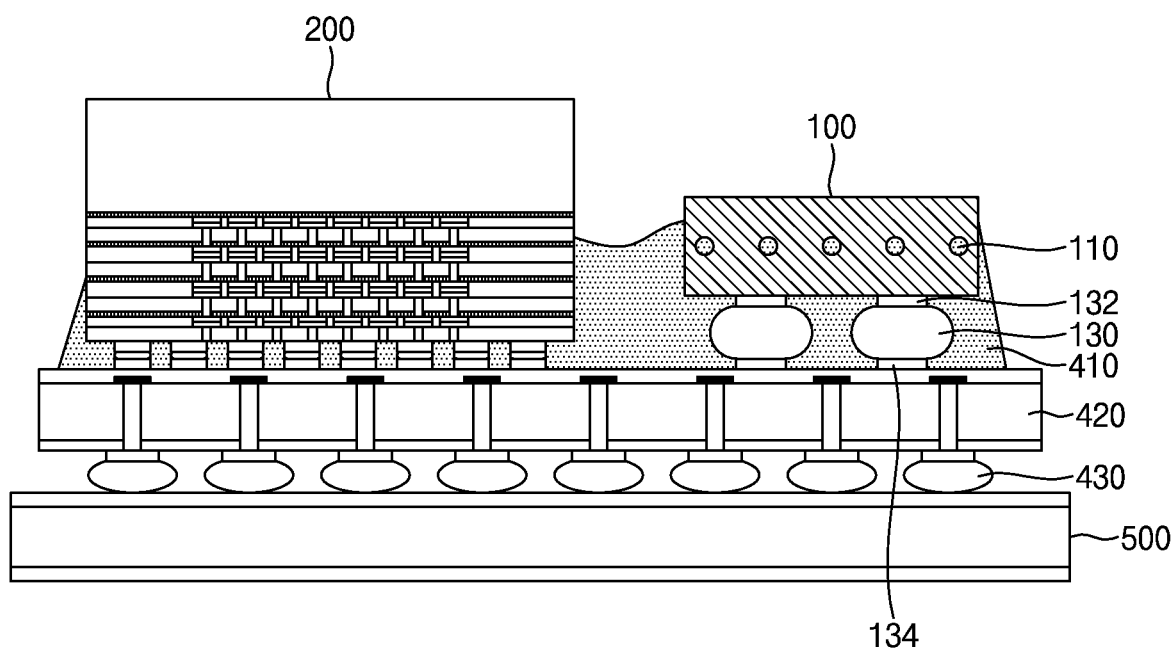
FIG. 13 is a cross-sectional view of an example of a semiconductor chip module according to the inventive concept, in which channels are formed in a lower end portion and a central portion of a dummy chip.

FIG. 13 illustrates an example of a semiconductor chip module according to the inventive concept, in which channels of epoxy resin are formed in a central portion of a dummy chip and below the dummy chip.

Referring to FIG. 13, a plurality of dummy bump joints 130 is disposed below a dummy chip 100. Empty spaces between the dummy bump joints 130 may be filled with an epoxy resin 410. That is, the spaces between the dummy bump joints 130 filled with an epoxy resin 410 may constitute channels. The channels may be formed in a lattice shape, with respective ones of the channels open in an X-axis direction and respective others of the channels open in a Y-axis direction below sides of the dummy chip 100. To prevent a warping of the chip package, a plurality of channels 110 of the epoxy resin 410 may also be formed in a central portion of the dummy chip 100. Thus, a warping of the chip package in the X-axis and Y-axis directions may be controlled. Accordingly, sufficient contact between the PCB 500 with the chip package may be ensured, and manufacturing efficiency of the semiconductor chip module may be high.

According to an aspect of the inventive concept described above, the profile of a substrate of a chip package can be matched to that of a PCB prior to the chip package being mounted to the PCB to ensure sufficient contact between the PCB and the chip package, and so that a manufacturing efficiency of a semiconductor chip module can be high.

According to another aspect of the inventive concept described above, in a chip package having active chips and dummy chips between the active chips, channels of epoxy resin can be formed in each dummy chip between an uppermost surface of a chip body of the dummy chip and a substrate of the chip package so that the warping of the substrate of the chip package can be controlled.

According to another aspect of the inventive concept described above, channels of epoxy resin can be formed in a bottom portion and/or a central portion and/or a top portion of each region of a chip package containing a dummy chip. Thus, the chip package can be warped or maintained flat in conformity with the profile of a PCB to which the chip package is fixed using the epoxy resin.

Although examples of the inventive concept have been described with reference to the accompanying drawings, it should be understood by those skilled in the art that various modifications may be made to such examples without departing from the scope of the inventive concept as defined by the appended claims. Therefore, the above-described examples should be considered in a descriptive sense only and not for purposes of limitation.

What is claimed is:

1. A semiconductor chip module comprising:
a chip package including a substrate, a processor disposed on the substrate in a central region of the substrate, a plurality of active chips disposed on the substrate around the processor, a plurality of dummy chips disposed on the substrate in spaces between the plurality of active chips, and epoxy resin fixing the plurality of active chips and the plurality of dummy chips to the substrate; and
a printed circuit board (PCB) to which the chip package is mounted,
wherein each of the dummy chips comprises a chip body having an upper surface, and
the semiconductor chip module has channels of the epoxy resin interposed between the upper surface of the chip body of each of the dummy chips and the substrate of the chip package.

2. The semiconductor chip module of claim 1, wherein for each of the dummy chips, a plurality of channels of the epoxy resin is interposed between the upper surface of the chip body of each of the dummy chip and the substrate of the chip package, the channels extending parallel to each other in a direction of an axis parallel to a side of the chip body of the dummy chip.

3. The semiconductor chip module of claim 1, wherein for each of the dummy chips, a plurality of channels of the epoxy resin is interposed between the upper surface of the chip body of the dummy chip and the substrate of the chip package, the channels extending diagonally relative to sides of the chip body of the dummy chip.

4. The semiconductor chip module of claim 1, wherein for each of the dummy chips, a plurality of channels of the epoxy resin extend within the dummy chip between an uppermost surface of the chip body and a lowermost surface of the chip body of the dummy chip.

5. The semiconductor chip module of claim 4, wherein the PCB is convex towards the chip package, and
the channels extend in bottom portions of the dummy chips adjacent to the substrate of the chip package.

6. The semiconductor chip module of claim 4, wherein the PCB is substantially flat, and
the channels extend midway between the uppermost surfaces and lowermost surfaces of the chip bodies of the dummy chips in vertically central portions of the dummy chips.

7. The semiconductor chip module of claim 4, wherein the PCB is concave towards the chip package, and
the channels extend in top portions of the dummy chips remote from the substrate of the chip package.

8. A semiconductor chip module comprising:
a chip package including a substrate having an upper surface, a processor disposed on the substrate in a central region of the upper surface of the substrate, a plurality of active chips disposed on the upper surface of the substrate around the processor, a plurality of dummy chips disposed on the upper surface substrate in spaces between the plurality of active chips, and epoxy resin fixing the plurality of active chips and the plurality of dummy chips to the substrate at the upper surface of the substrate; and
a printed circuit board (PCB) having an upper surface to which the chip package is mounted,
wherein each of the dummy chips comprises a chip body having an upper surface,
the semiconductor chip module has a plurality of first channels of the epoxy resin and a plurality of second channels of the epoxy resin interposed between the upper surface of the chip body of each of the dummy chips and the substrate of the chip package,
the first channels extend longitudinally in a first axial direction and the second channels extend longitudinally in a second axial direction different from the first axial direction, and
the first channels are spaced a predetermined distance apart from the plurality of second channels in a vertical direction perpendicular to the upper surface of the substrate of the chip package.

9. The semiconductor chip module of claim 8, wherein the first and second axial directions are orthogonal.

10. The semiconductor chip module of claim 9, wherein in each of the dummy chips the plurality of first channels extend in one of a bottom portion, a central portion, and a top portion of the dummy chip relative to the substrate of the chip package, and
the second channels also extend in said one of the bottom portion, central portion, and top portion of the dummy chip.

11. The semiconductor chip module of claim 10, wherein the PCB is convex towards the chip package, and
in each of the dummy chips, the plurality of first channels and the plurality of second channels extend in the bottom portion of the dummy chip.

12. The semiconductor chip module of claim 10, wherein the PCB is substantially flat, and
in each of the dummy chips, the plurality of first channels and the plurality of second channels extend in the central portion of each of the dummy chip.

13. The semiconductor chip module of claim 10, wherein the PCB is concave towards the chip package, and
in each of the dummy chips, the plurality of first channels and the plurality of second channels extend in the top portion of the dummy chip.

14. The semiconductor chip module of claim 9, wherein in each of the dummy chips the plurality of first channels extend in a bottom portion of the dummy chip adjacent to the substrate of the chip package, and
the plurality of second channels extend midway between an uppermost surface of the chip body of the dummy chip and a lowermost surface of the chip body in a central portion of the dummy chip.

15. The semiconductor chip module of claim 9, wherein in each of the dummy chips the plurality of first channels extend in a bottom portion of the dummy chip adjacent to the substrate of the chip package, and
the second channels extend in a top portion of the dummy chip remote from the substrate of the chip package.

16. The semiconductor chip module of claim 9, wherein in each of the dummy chips the plurality of first channels extend midway between an uppermost surface of the chip body of the dummy chip and a lowermost surface of the chip body in a central portion of the dummy chip, and
the second channels extend in a top portion of each of the dummy chip remote from the substrate of the chip package.

17. The semiconductor chip module of claim 8, wherein in each of the dummy chips the first channels each extend longitudinally in a diagonal direction relative to sides of the chip body of the dummy chip, and
the second channels each extend longitudinally at a right angle to the diagonal direction.

18. The semiconductor chip module of claim 8, wherein in each of the dummy chips the first channels each extend longitudinally in a direction perpendicular to a side of the chip body of the dummy chip, and
the second channels each extend longitudinally in a diagonal direction relative to said side of the chip body of the dummy chip.

19. A semiconductor chip module comprising:
a chip package including a substrate, a processor disposed in a central region of the substrate, a plurality of active chips disposed on the substrate around the processor, a plurality of dummy chips disposed on the substrate in spaces between the plurality of active chips, a plurality of dummy bump joints interposed between each of the dummy chips and the substrate, and an epoxy resin configured to package the plurality of active chips and the plurality of dummy chips; and
a printed circuit board (PCB) to which the chip package is mounted,
wherein each of the dummy chips comprises a chip body having an upper surface,
the plurality of dummy bump joints are spaced laterally from each other to define spaces therebetween, and
the spaces between the dummy bump joints are filled with the epoxy resin such that channels of the epoxy resin are interposed between the upper surface of the chip body of each of the dummy chips and the substrate of the chip package.

20. The semiconductor chip module of claim 19, wherein the channels of the epoxy resin have the form of a lattice such that first ones of the channels between the upper surface of the chip body of each of the dummy chips and the substrate of the chip package each extend longitudinally in a first axial direction and second ones of the channels between the upper surface of the chip body of each of the dummy chips and the substrate of the chip package each extend longitudinally in a second axial direction orthogonal to the first axial direction.

* * * * *